(12) United States Patent
Lee et al.

(10) Patent No.: US 12,484,382 B2
(45) Date of Patent: Nov. 25, 2025

(54) DISPLAY APPARATUS

(71) Applicant: Samsung Display Co., Ltd., Yongin-si (KR)

(72) Inventors: Sangshin Lee, Yongin-si (KR); Sanghoon Kim, Yongin-si (KR); Jongsung Park, Yongin-si (KR); Seungjin Lee, Yongin-si (KR); Eunjoung Jung, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 590 days.

(21) Appl. No.: 17/751,111

(22) Filed: May 23, 2022

(65) Prior Publication Data

US 2023/0037080 A1 Feb. 2, 2023

(30) Foreign Application Priority Data

Jul. 28, 2021 (KR) ........................ 10-2021-0099438

(51) Int. Cl.
*H01L 27/32* (2006.01)
*H01L 51/52* (2006.01)
*H10K 59/122* (2023.01)
*H10K 59/80* (2023.01)

(52) U.S. Cl.
CPC ..... *H10K 59/122* (2023.02); *H10K 59/80521* (2023.02)

(58) Field of Classification Search
CPC .. H10K 59/122; H10K 59/352; H10K 59/121; H10K 59/80521; H10K 59/124; H10K 59/123; H10K 50/822; H10K 50/824; H10K 50/813; H10K 50/00–88; H10K 71/00–861

See application file for complete search history.

(56) References Cited

U.S. PATENT DOCUMENTS

| | | | |
|---|---|---|---|
| 9,054,058 | B2 | 6/2015 | Sugisawa et al. |
| 10,516,004 | B2 | 12/2019 | Park et al. |
| 10,541,378 | B2 | 1/2020 | Maeda |

(Continued)

FOREIGN PATENT DOCUMENTS

| | | |
|---|---|---|
| JP | 2018-194572 | 12/2018 |
| KR | 2013-0007971 A | 1/2013 |

(Continued)

*Primary Examiner* — Steven B Gauthier
*Assistant Examiner* — Rhys Poniente Sheker
(74) *Attorney, Agent, or Firm* — Harness, Dickey & Pierce, P.L.C.

(57) ABSTRACT

A display apparatus includes a first pixel and a second pixel arranged on a substrate and adjacent to each other; and each including a common layer and an opposite electrode each being provided as a body; a pixel-defining layer including openings respectively corresponding to the first pixel and the second pixel and defining emission areas; and a structural layer arranged on the pixel-defining layer and including an upper surface, a first lateral surface, and a second lateral surface. The first lateral surface is connected to the upper surface and has a slope tapered in a reverse direction. The second lateral surface is connected to the upper surface and has a slope tapered in a forward direction. Each of the common layer and the opposite electrode includes a discontinuous portion disconnected by the first lateral surface.

20 Claims, 37 Drawing Sheets

(56) References Cited

U.S. PATENT DOCUMENTS

| | | | |
|---|---|---|---|
| 10,950,673 B2 | 3/2021 | Bae et al. | |
| 10,991,776 B2 | 4/2021 | Kim et al. | |
| 11,063,096 B2 | 7/2021 | Heo | |
| 2013/0001620 A1* | 1/2013 | Sugisawa | H10K 59/122 |
| | | | 257/E33.062 |
| 2018/0190731 A1* | 7/2018 | Park | G09G 3/20 |
| 2019/0363139 A1* | 11/2019 | Nishioka | H05B 33/22 |
| 2020/0035768 A1* | 1/2020 | Okabe | H10K 50/11 |
| 2020/0212144 A1 | 7/2020 | Ahn et al. | |
| 2022/0077252 A1* | 3/2022 | Choung | H10K 71/00 |

FOREIGN PATENT DOCUMENTS

| | | |
|---|---|---|
| KR | 10-2018-0052825 | 5/2018 |
| KR | 2018-0079059 A | 7/2018 |
| KR | 10-1948898 | 2/2019 |
| KR | 2019-0130705 A | 11/2019 |
| KR | 2020-0042996 A | 4/2020 |
| KR | 10-2020-0082986 | 7/2020 |

* cited by examiner

DISPLAY APPARATUS

CROSS-REFERENCE TO RELATED APPLICATION(S)

This application is based on and claims priority to and the benefit of Korean Patent Application No. 10-2021-0099438 under 35 U.S.C. § 119, filed on Jul. 28, 2021, in the Korean Intellectual Property Office (KIPO), the entire contents of which are incorporated herein by reference.

BACKGROUND

1. Technical Field

One or more embodiments relate to a display apparatus with an improved display quality by preventing light emission due to a leakage current.

2. Description of the Related Art

Among display apparatuses, an organic light-emitting display apparatus has advantages of a wide viewing angle, excellent contrast, and fast response speeds, and has been increasing and becoming more popular.

An organic light-emitting display apparatus includes thin-film transistors and organic light-emitting diodes on a substrate, wherein the organic light-emitting diodes spontaneously emit light. Organic light-emitting display apparatuses are used as displays of small-scale products such as mobile phones and large-scale products such as televisions.

An organic light-emitting display apparatus includes an organic light-emitting element as each (sub)-pixel. Each of the (sub)-pixels includes a pixel electrode, an opposite electrode, and an intermediate layer therebetween, and the intermediate layer includes an emission layer. An organic light-emitting display apparatus controls the emission of light or a light-emitting degree of each pixel by using a thin-film transistor electrically connected to the pixel electrode. The opposite electrode is commonly provided as a single body over the (sub)-pixels.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

However, in display apparatuses according to the related art, a non-light-emitting pixel around a light-emitting pixel emits light simultaneously therewith due to a leakage current between pixels adjacent thereto, and thus, display quality may be deteriorated.

One or more embodiments include a display apparatus with an improved display quality by preventing light emission due to a leakage current. However, such a technical problem is an example, and the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a first pixel and a second pixel arranged on a substrate and adjacent to each other, and each including a common layer and an opposite electrode each being provided as one body, a pixel-defining layer including openings respectively corresponding to the first pixel and the second pixel and defining emission areas, and a structural layer arranged on the pixel-defining layer and including an upper surface, a first lateral surface, and a second lateral surface. The first lateral surface is connected to the upper surface and has a slope tapered in a reverse direction. The second lateral surface may be connected to the upper surface and may have a slope tapered in a forward direction. Each of the common layer and the opposite electrode may include a discontinuous portion disconnected by the first lateral surface.

The first lateral surface and the second lateral surface may be arranged in a first direction parallel to a side of the first pixel.

The structural layer may include a third lateral surface and a fourth lateral surface. Each of the third lateral surface and the fourth lateral surface may have a slope tapered in a forward direction. The third lateral surface and the fourth lateral surface may be arranged in a second direction intersecting the first direction.

The structural layer may include a third lateral surface and a fourth lateral surface. Each of the third lateral surface and the fourth lateral surface may have a slope tapered in a reverse direction. The third lateral surface and the fourth lateral surface may be arranged in a second direction intersecting the first direction.

The structural layer may include a third lateral surface and a fourth lateral surface. The third lateral surface may have a slope tapered in a reverse direction. The fourth lateral surface may have a slope tapered in a forward direction. The third lateral surface and the fourth lateral surface may be arranged in a second direction intersecting the first direction.

The structural layer may include a third lateral surface and a fourth lateral surface. The third lateral surface may have a slope tapered in a reverse direction. The fourth lateral surface may have a slope tapered in a forward direction. The first lateral surface and the third lateral surface may be arranged in a first direction parallel to one side of the first pixel. The second lateral surface and the fourth lateral surface may be arranged in a second direction intersecting the first direction.

The structural layer may include a first sub-structural layer and a second sub-structural layer. The first sub-structural layer and the second sub-structural layer may be spaced apart from and parallel to each other between the first pixel and the second pixel. The first sub-structural layer may include a first upper surface, a (1-1)st lateral surface, and a (1-2)nd lateral surface. Each of the (1-1)st lateral surface and the (1-2)nd lateral surface may be connected to the first upper surface. The (1-1)st lateral surface may have a slope tapered in a reverse direction. The (1-2)nd lateral surface may have a slope tapered in a forward direction. The second sub-structural layer may include a second upper surface, a (2-1)st lateral surface, and a (2-2)nd lateral surface. Each of the (2-1)st lateral surface and the (2-2)nd lateral surface may be connected to the second upper surface. The (2-1)st lateral surface may have a slope tapered in a reverse direction. The (2-2)nd lateral surface may have a slope tapered in a forward direction.

The (1-1)st lateral surface, the (1-2)nd lateral surface, the (2-1)st lateral surface, and the (2-2)nd lateral surface may be arranged in a first direction parallel to one side of the first pixel. The (1-2)nd lateral surface may face the (2-2)nd lateral surface.

The (1-1)st lateral surface, the (1-2)nd lateral surface, the (2-1)st lateral surface, and the (2-2)nd lateral surface may be arranged in a first direction parallel to one side of the first pixel. The (1-2)nd lateral surface may face the (2-1)st lateral surface.

The (1-1)st lateral surface, the (1-2)nd lateral surface, the (2-1)st lateral surface, and the (2-2)nd lateral surface may be arranged in a first direction parallel to one side of the first pixel. The (1-1)st lateral surface may face the (2-1)st lateral surface.

Each of the first sub-structural layer may include a (1-3)rd lateral surface connected to the first upper surface and having a slope tapered in a reverse direction. The second sub-structural layer may include a (2-3)rd lateral surface connected to the second upper surface and having a slope tapered in a reverse direction. The (1-1)st lateral surface, the (1-3)rd lateral surface, the (2-1)st lateral surface, and the (2-3)rd lateral surface may be arranged in a first direction parallel to one side of the first pixel. The (1-2)nd lateral surface and the (2-2)nd lateral surface may be arranged in a second direction intersecting the first direction.

The first pixel and the second pixel may each include an organic light-emitting diode. The organic light-emitting diode may include a pixel electrode, a lower emission layer arranged on the pixel electrode, an upper emission layer arranged on the lower emission layer, a charge-generating layer arranged between the lower emission layer and the upper emission layer, and the opposite electrode arranged on the upper emission layer. The charge-generating layer and the opposite electrode may each be arranged as a body on the first pixel and the second pixel.

The display apparatus may further include a third pixel adjacent to the first pixel and the second pixel. The first pixel, the second pixel, and the third pixel may emit light in different wavelengths, respectively. The structural layer may include a first structural layer arranged in a first direction between the first pixel and the third pixel.

A length of first structural layer in the first direction may be equal to or greater than a width of a third emission area of the third pixel in the first direction.

The structural layer may further include a second structural layer arranged in a second direction intersecting the first direction between the first pixel and the second pixel.

The display apparatus may further include a third pixel adjacent to the first pixel and the second pixel. The first pixel, the second pixel, and the third pixel may emit light in different wavelengths, respectively. The structural layer may include a first structural layer arranged in parallel to four sides of a third emission area of the third pixel.

A length of the first structural layer in a first direction may be equal to or greater than a width of the third emission area in the first direction.

The structural layer may further include a second structural layer arranged between the first pixel and the second pixel.

According to one or more embodiments, a display apparatus may include a first pixel and a second pixel adjacent to each other and disposed on a substrate, and each including a common layer and an opposite electrode each being provided as a body, a pixel-defining layer including openings respectively corresponding to the first pixel and the second pixel and defining an emission area, and a structural layer arranged on the pixel-defining layer and including a first lateral surface and a second lateral surface. The first lateral surface may have a tip structure protruding to the emission area. The second lateral surface may have a slope tapered in a forward direction. Each of the common layer and the opposite electrode may include a discontinuous portion disconnected by the tip structure.

The structural layer may include an inorganic material or an organic material.

These and/or other aspects will become apparent and more readily appreciated from the following description of the embodiments, the accompanying drawings, and claims.

BRIEF DESCRIPTION OF THE DRAWINGS

An additional appreciation according to the embodiments of the disclosure will become more apparent by describing in detail the embodiments thereof with reference to the accompanying drawings, in which.

DETAILED DESCRIPTION OF THE EMBODIMENTS

Figure 1:
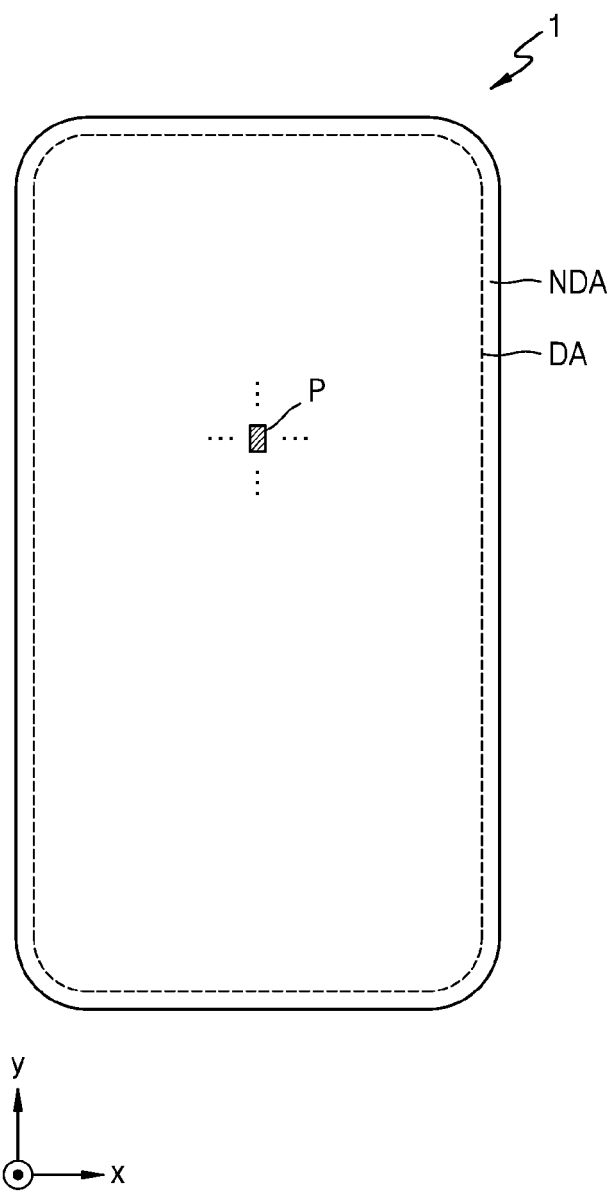
FIG. 1 is a schematic plan view of a portion of a display apparatus according to an embodiment.

Embodiments of the disclosure will be described hereinafter with reference to the accompanying drawings. Although the embodiments may be modified in various manners and have additional embodiments, embodiments are illustrated in the accompanying drawings and will be mainly described in the specification. However, the scope of the disclosure is not limited to the embodiments in the accompanying drawings and the specification and should be construed as including all the changes, equivalents and substitutions included in the spirit and scope of the disclosure. In the specification and the claims, the phrase "at least one of" is intended to include the meaning of "at least one selected from the group of" for the purpose of its meaning and interpretation. For example, "at least one of A and B" may be understood to mean "A, B, or A and B."

Some of the parts which are not associated with the description may not be provided in order to describe embodiments of the disclosure and like reference numerals refer to like elements throughout the specification.

Further, in the specification, the phrase "in a plan view" means when an object portion is viewed from above, and the phrase "in a cross-sectional view" means when a cross-section taken by vertically cutting an object portion is viewed from the side.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

In the specification, "A and/or B" means A or B, or A and B. The phrase "at least one of" is intended to include the meaning of "at least one selected from the group of" for the purpose of its meaning and interpretation. For example, "at least one of A and B" may be understood to mean "A, B, or A and B."

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When an embodiment may be implemented differently, a certain process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Sizes of elements in the drawings may be exaggerated or reduced for convenience of explanation. For example, since sizes and thicknesses of elements in the drawings are arbitrarily illustrated for convenience of explanation, the disclosure is not limited thereto.

Unless otherwise defined or implied herein, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic plan view of a portion of a display apparatus 1 according to an embodiment.

Referring to FIG. 1, the display apparatus 1 may include a display area DA and a peripheral area NDA disposed outside the display area DA. Pixels P may be arranged in the display area DA. Each of the pixels P may include a display element. The display apparatus 1 may display images by using light emitted from an array of the pixels P. The pixels P may be two-dimensionally arranged in the display area DA. The peripheral area NDA may be a kind of non-display area in which the display elements of the pixels P are not arranged. The display area DA may be surrounded by the peripheral area NDA. For example, the peripheral area NDA may entirely surround the display area DA.

Though FIG. 1 illustrates the display apparatus 1 including a flat display surface, the embodiment is not limited thereto. In another embodiment, the display apparatus 1 may include a three-dimensional display surface or a curved display surface.

In case that the display apparatus 1 includes a three-dimensional display surface, the display apparatus 1 may include display areas pointing (or arranged) in different directions, and include, for example, a polygonal prism display surface. In another embodiment, in case that the display apparatus 1 includes the curved display surface, the display apparatus 1 may be implemented in various shapes such as flexible, foldable, and rollable display apparatuses.

In an embodiment, FIG. 1 shows the display apparatus 1 applicable to a mobile phone terminal. Though not shown, electronic modules mounted on a mainboard, a camera module, a power module, and the like may be arranged together with the display apparatus 1 in a bracket/case, and configure a mobile phone terminal. The display apparatus 1 according to an embodiment may be applicable to small and medium-scale electronic apparatuses such as tablet computers, automobile navigations, game consoles, smartwatches, and the like as well as large-scale electronic apparatuses such as televisions, monitors, and the like.

Though FIG. 1 illustrates the case where the edges of the display area DA of the display apparatus 1 are round quadrangles, the shape of the display area DA may be circular, elliptical, or polygonal such as triangles or pentagons and the like in another embodiment.

Hereinafter, though an organic light-emitting display apparatus is described as an example of the display apparatus 1 according to an embodiment, the embodiment is not limited thereto. In another embodiment, the display apparatus 1 according to an embodiment may be a display apparatus such as an inorganic light-emitting display apparatus or a quantum-dot light-emitting display apparatus. As an example, an emission layer of a display element of the display apparatus 1 may include an organic material, an inorganic material, quantum dots, a mixture of an organic material and quantum dots, or a mixture of an inorganic material and quantum dots.

Figure 2:
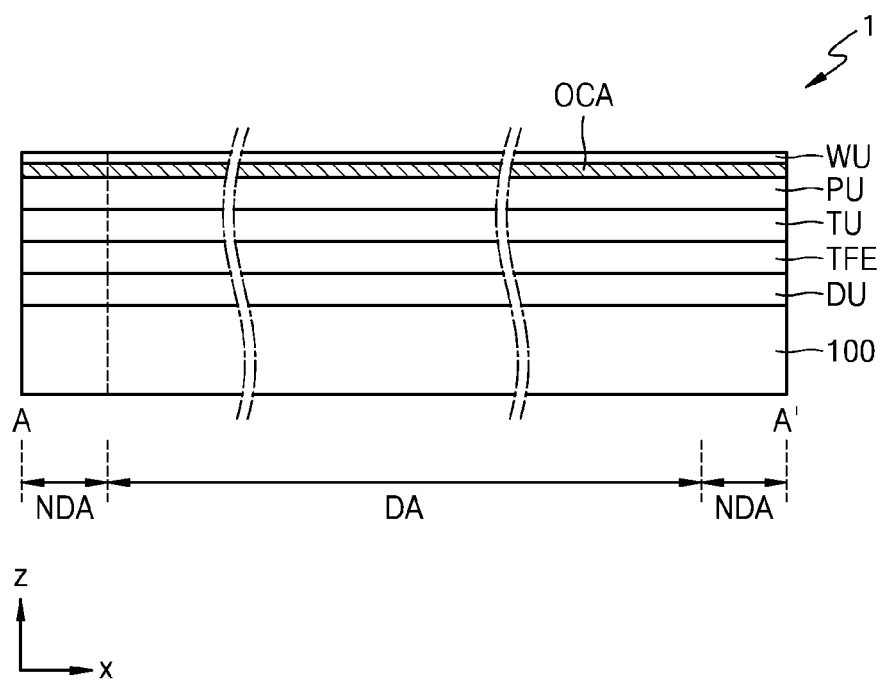
FIG. 2 is a schematic cross-sectional view of the display apparatus of FIG. 1, taken along line A-A' of FIG. 1.

FIG. 2 is a schematic cross-sectional view of the display apparatus 1 of FIG. 1, taken along line A-A' of FIG. 1.

Referring to FIG. 2, the display apparatus 1 according to an embodiment may include a display layer DU, a thin-film encapsulation layer TFE, an input-sensing layer TU, an anti-reflection layer PU, and a window layer WU. At least some of the display layer DU, the thin-film encapsulation layer TFE, the input-sensing layer TU, the anti-reflection layer PU, and the window layer WU may be formed by a successive process, or at least some of the above-described layers DU, TFE, TU, PU, and WU may be coupled to each other through an adhesive member. FIG. 2 shows an optical transparent adhesive member OCA as an adhesive member. An adhesive member described below may include a general adhesive. In an embodiment, the anti-reflection layer PU and the window layer WU may be replaced with other elements or omitted.

The display layer DU may include the pixels P described with reference to FIG. 1. The thin-film encapsulation layer TFE may be arranged to seal a display element, for example, an organic light-emitting diode OLED (e.g., refer to FIGS. 4 and 5) included in each of the pixels P. The thin-film encapsulation layer TFE may include at least one inorganic encapsulation layer and/or at least one organic encapsulation layer.

The display layer DU may generate images, and the input-sensing layer TU may obtain (or sense) coordinate information of an external input (e.g., a touch event). Though not shown in the figures, a display panel DP according to an embodiment may further include a protection member arranged on a backside (or rear surface) of a substrate 100. The protection member may be coupled to the substrate 100 by an adhesive member.

In an embodiment, the input-sensing layer TU may be arranged (e.g., directly arranged) on the thin-film encapsulation layer TFE. In case that an "element B is directly arranged on an element A" in the specification, it means that a separate adhesive layer/adhesive member may not be arranged between the element A and the element B. The element B may be formed on a base surface provided by the element A after the element A is formed. In another embodiment, the input-sensing layer TU may not be directly arranged on the thin-film encapsulation layer TFE. The input-sensing layer TU may be formed by a separate process and arranged on the thin-film encapsulation layer TFE through an adhesive member.

The display panel DP may include the display layer DU, the thin-film encapsulation layer TFE disposed on the substrate 100, the input-sensing layer TU directly arranged on the thin-film encapsulation layer TFE, and the anti-reflection layer PU. The optical transparent adhesive member OCA may be arranged between the display panel DP and the window layer WU.

The anti-reflection layer PU may reduce the reflectivity of external light incident into the window layer WU from above the window layer WU. In an embodiment, the anti-reflection layer PU may include a black matrix and color filters. The color filters may be arranged to respectively correspond to emission areas EA (e.g., EA1 and EA2 of FIG. 6) of the pixels P (e.g., refer to FIG. 1). The black matrix may be arranged to correspond to non-emission areas NEA (e.g., refer to FIG. 6) between the pixels P (e.g., refer to FIG. 1). In an embodiment, an adhesive member may not be arranged between the input-sensing layer TU and the anti-reflection layer PU. The anti-reflection layer PU may be directly arranged on the input-sensing layer TU.

Though it is shown in FIG. 2 that the anti-reflection layer PU is arranged on the input-sensing layer TU, the anti-reflection layer PU may be arranged on the thin-film encapsulation layer TFE, and the input-sensing layer TU may be arranged on the anti-reflection layer PU in another embodiment.

Figure 3:
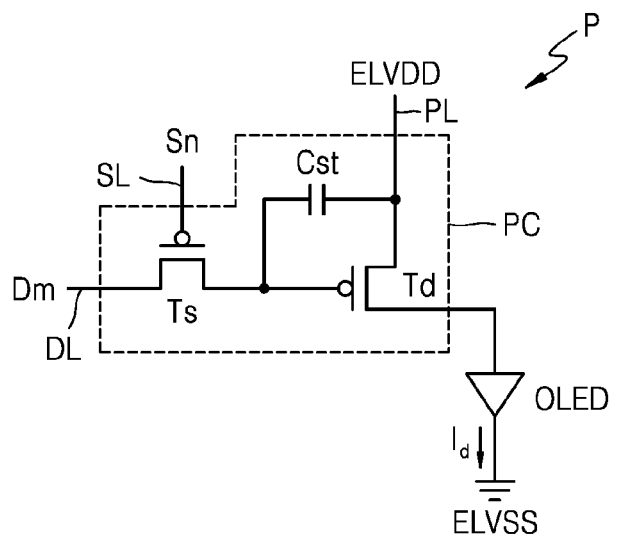
FIG. 3 is a schematic diagram of an equivalent circuit of a pixel included in a display apparatus according to an embodiment.

FIG. 3 is a schematic diagram of an equivalent circuit of a pixel included in a display apparatus according to an embodiment.

Referring to FIG. 3, each pixel P may include a pixel circuit PC and a display element (also referred as organic light-emitting diode) OLED. The pixel circuit PC may be electrically connected to a scan line SL and a data line DL. The display element OLED may be electrically connected to the pixel circuit PC.

The pixel circuit PC may include a driving thin-film transistor Td, a switching thin-film transistor Ts, and a storage capacitor Cst. The switching thin-film transistor Ts may be electrically connected to the scan line SL and the data line DL. The switching thin-film transistor Ts may be configured to transfer a data signal Dm to the driving thin-film transistor Td according to a scan signal Sn input through the scan line SL. The data signal Dm may be input to the switching thin-film transistor Ts through the data line DL.

The storage capacitor Cst may be electrically connected to the switching thin-film transistor Ts and a driving voltage line PL. The storage capacitor Cst may be configured to store a voltage corresponding to a difference between a voltage transferred from the switching thin-film transistor Ts and a driving voltage ELVDD supplied through the driving voltage line PL.

The driving thin-film transistor Td may be electrically connected to the driving voltage line PL and the storage capacitor Cst. The driving thin-film transistor Td may be configured to control a driving current $I_d$ flowing from the driving voltage line PL to the display element OLED according to the voltage stored in the storage capacitor Cst. The display element OLED may emit light having a brightness according to the driving current $I_d$. For example, the brightness of the light emitted from the display element OLED may be changed according to the driving current $I_d$.

Though FIG. 3 illustrates the case where the pixel circuit PC includes two thin-film transistors and one storage capacitor, but the embodiment is not limited thereto. In another embodiment, the pixel circuit PC may include seven thin-film transistors and one storage capacitor. In another embodiment, the pixel circuit PC may include two or more storage capacitors.

Figure 4:
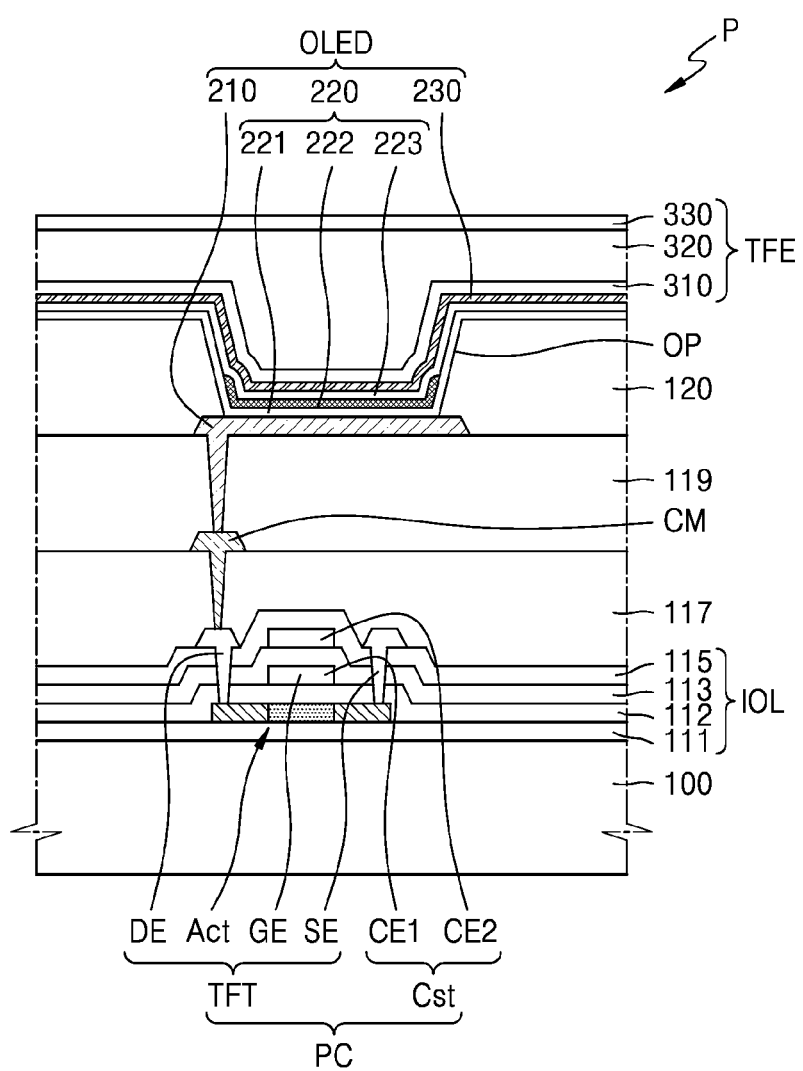
FIGS. 4 and 5 are schematic cross-sectional views of a portion of a display apparatus according to an embodiment.
Figure 5:
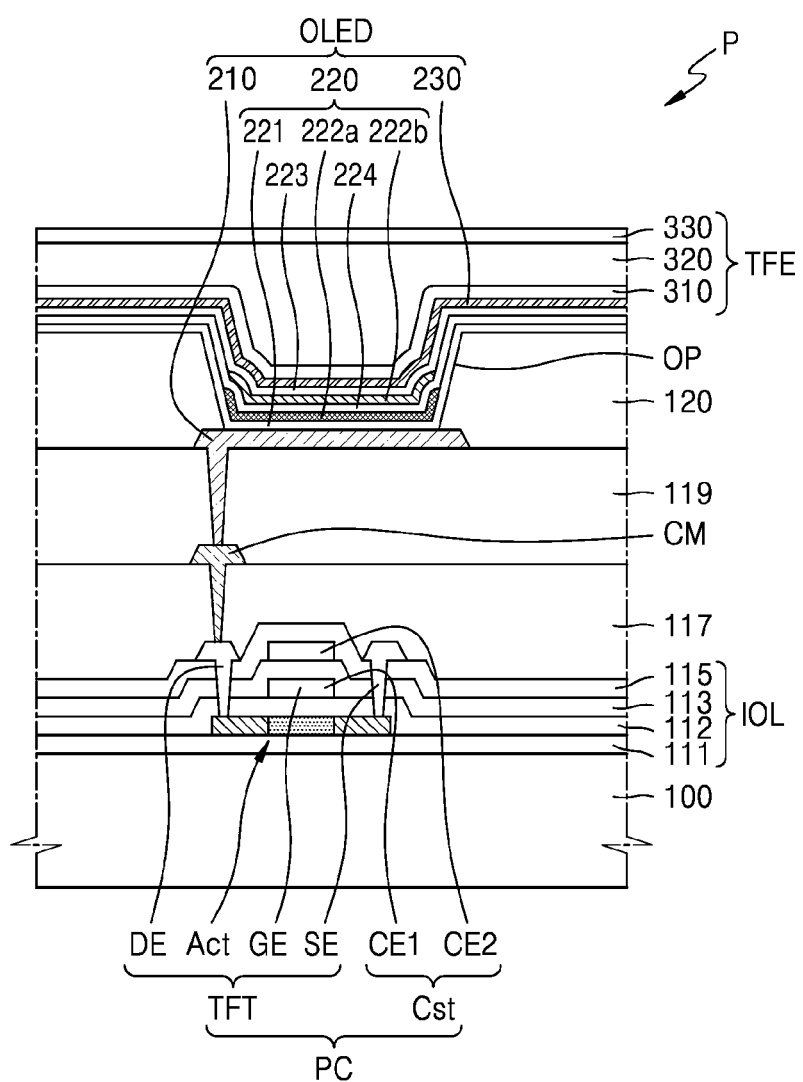

FIGS. 4 and 5 are schematic cross-sectional views of a portion of a display apparatus according to an embodiment.

Referring to FIGS. 4 and 5, a pixel P in a display area DA (e.g., refer to FIG. 1) may include a pixel circuit PC, and the pixel circuit PC may include a thin-film transistor TFT and a storage capacitor Cst. The thin-film transistor TFT of FIGS. 4 and 5 may be one of the above-described thin-film transistors (e.g., the driving thin-film transistor Td and the switching thin-film transistor Ts of FIG. 3). For example, the thin-film transistor TFT of FIGS. 4 and 5 may be, for example, the driving thin-film transistor Td (e.g., refer to FIG. 3).

An inorganic insulating layer IOL may include a buffer layer 111, a gate insulating layer 112, a first interlayer insulating layer 113, and a second interlayer insulating layer 115.

The buffer layer 111 may be arranged on a substrate 100, and prevent the penetration of impurities. The gate insulating layer 112 may be arranged between a semiconductor layer Act and a gate electrode GE of the thin-film transistor TFT. The first interlayer insulating layer 113 may be arranged between a lower electrode (or first electrode) CE1 and an upper electrode (or second electrode) CE2 of the storage capacitor Cst, and serve as a dielectric. The second interlayer insulating layer 115 may be arranged between the gate electrode GE, and a source electrode SE and a drain electrode DE of the thin-film transistor TFT.

Each of the buffer layer 111, the gate insulating layer 112, the first interlayer insulating layer 113, and the second interlayer insulating layer 115 may include an inorganic insulating material. Each of the buffer layer 111, the gate insulating layer 112, the first interlayer insulating layer 113, and the second interlayer insulating layer 115 may include silicon nitride, silicon oxide, and/or silicon oxynitride.

Though FIGS. 4 and 5 illustrates the case where the thin-film transistor TFT overlaps the storage capacitor Cst such that the gate electrode GE of the thin-film transistor TFT also serves as the lower electrode CE1 of the storage capacitor Cst, the embodiment is not limited thereto. In an embodiment, the lower electrode CE1 and the gate electrode GE may be arranged on a same layer. The upper electrode CE2 of the storage capacitor Cst, the source electrode SE, and the drain electrode DE may be arranged on a same layer. Thus, the lower electrode CE1 and the gate electrode GE may include a same material, and the upper electrode CE2, the source electrode SE, and the drain electrode DE may include a same material. However, the embodiment is not limited thereto and may be variously modified.

In addition, though FIGS. 4 and 5 illustrate the case where the thin-film transistor TFT of the pixel circuit PC is a top-gate type thin-film transistor, the embodiment is not limited thereto. In another embodiment, the thin-film transistor TFT may be a bottom-gate type thin-film transistor.

The organic light-emitting diode OLED may include a pixel electrode 210, an opposite electrode 230, and an intermediate layer 220, the pixel electrode 210 being electrically connected to the pixel circuit PC through a contact metal CM with a first planarization layer 117 and a second planarization layer 119 that include a contact hole therebetween, the opposite electrode 230 facing the pixel electrode 210, and the intermediate layer 220 being between the pixel electrode 210 and the opposite electrode 230. In an embodiment, each of the first planarization layer 117 and the second planarization layer 119 may include an organic insulating material.

A pixel-defining layer 120 may be arranged on the second planarization layer 119. The pixel-defining layer 120 may include an organic insulating material. In an embodiment, the pixel-defining layer 120 may include a light-blocking material, and the light-blocking material may be provided in black. The light-blocking material may include carbon black, a carbon nano tube, a resin or paste including a black dye, metal particles, for example, nickel, aluminum, molybdenum, and an alloy thereof, metal oxide particles (e.g., chrome oxide), or metal nitride particles (e.g., chrome nitride), and the like. In case that the pixel-defining layer 120 includes a light-blocking material, external light reflection due to metal structures (e.g., source electrode SE, drain electrode DE, upper electrode CE2, or the like) arranged below the pixel-defining layer 120 may be reduced.

The pixel electrode 210 may be exposed through an opening OP of the pixel-defining layer 120, and edges of the pixel electrode 210 may be covered by the pixel-defining layer 120 including an organic insulating material. In an embodiment, the pixel electrode 210 may include silver (Ag), magnesium (Mg), aluminum (Al), platinum (Pt), palladium (Pd), gold (Au), nickel (Ni), neodymium (Nd), iridium (Ir), chrome (Cr), an alloy thereof, or a compound (or combination) thereof.

The opposite electrode 230 may be formed as a body and cover (or overlap) the display area DA entirely. In an embodiment, the opposite electrode 230 may include a thin-film metal layer containing Ag and Mg, or a transparent conductive oxide (TCO) such as indium tin oxide (ITO), indium zinc oxide (IZO), zinc oxide (ZnO), indium oxide ($In_2O_3$), indium gallium oxide (IGO), or aluminum zinc oxide (AZO).

In an embodiment, a capping layer 240 (e.g., refer to FIG. 9A) may be arranged on the opposite electrode 230. As an example, the capping layer 240 (e.g., refer to FIG. 9A) may include one of an organic material, an inorganic material, a mixture thereof, and a compound thereof. The capping layer 240 (e.g., refer to FIG. 9A) may include a single layer or a multi-layer. In an embodiment, a lithium fluoride (LiF) layer may be arranged on the capping layer 240 (e.g., refer to FIG. 9A).

The organic light-emitting diode OLED may emit red, green, blue, or white light. The intermediate layer 220 may include an organic material including a fluorescent or phosphorous material emitting red, green, and blue light and be patterned to correspond to the pixel P in the display area DA.

In an embodiment, as shown in FIG. 4, the intermediate layer 220 may include an emission layer 222 patterned to correspond to the pixel P. A first common layer 221 and a second common layer 223 may be respectively provided under/on the emission layer 222. The first common layer 221 may be disposed between the emission layer 222 and the pixel electrode 210, and the second common layer 223 may be disposed between the emission layer 222 and the opposite electrode 230. Each of the first common layer 221 and the second common layer 223 may be arranged as a body and cover the display area DA entirely.

In an embodiment, the first common layer 221 may include a hole injection layer (HIL) and a hole transport layer (HTL), and the second common layer 223 may include an electron transport layer (ETL) and an electron injection layer (EIL). In another embodiment, at least one of an HIL, an HTL, an ETL, and an EIL may be omitted.

An HIL may facilitate hole injection and include at least one of hexaaza-triphenylene-hexacarbonitrile (HATCN), cupper phthalocyanine (CuPc), poly((3,4)-ethylenedioxythiophene) (PEDOT), polyaniline (PANI), and N,N-dinaphthyl-N, and N'-diphenylbenzidine (NPD), but the disclosure is not limited thereto.

An HTL may include, as a host of an HTL, triphenylamine derivatives having a high hole mobility and desirable stability such as TPD (N,N'-diphenyl-N,N'-bis(3-methylphenyl)-1,1'-bi-phenyl-4,4'-diamine) or NPB (N,N'-di(naphthalen-1-yl)-N,N'-diphenyl-benzidine).

An ETL may facilitate electron transport and include one of Alq3 (tris(8-hydroxyquinolino)aluminum), PBD, TAZ, spiro-PBD, BAlq, Liq (lithium quinolate), BMB-3T, PF-6P, TPBI, COT, and SAlq but is not limited thereto.

An EIL may facilitate (or enhance) electron injection and include at least one of Yb, Alq3 (tris(8-hydroxyquinolino)

aluminum), PBD, TAZ, spiro-PBD, BAlq, and SAlq, but the disclosure is not limited thereto.

In another embodiment, as shown in FIG. 5, the intermediate layer 220 may include multiple emission layers (e.g., the lower emission layer 222a and the upper emission layer 222b). For example, the intermediate layer 220 may include the lower emission layer 222a and the upper emission layer 222b overlapping each other. The lower emission layer 222a and the upper emission layer 222b may be patterned to correspond to the opening OP of the pixel-defining layer 120.

In an embodiment, the lower emission layer 222a and the upper emission layer 222b overlapping each other may emit light in a same wavelength or emit light in different wavelengths. As an example, in case that the organic light-emitting diode OLED emits red light, the lower emission layer 222a may emit red light, and the upper emission layer 222b may equally emit red light.

In an embodiment, a charge-generating layer 224 may be arranged between the lower emission layer 222a and the upper emission layer 222b. Unlike the lower emission layer 222a and the upper emission layer 222b patterned to correspond to the pixel P, the charge-generating layer 224 may be a common layer formed over the display area DA entirely. The charge-generating layer 224 may supply charge to the first common layer 221, the lower emission layer 222a, the upper emission layer 222b, and the second common layer 223.

The charge-generating layer 224 may include an n-type charge-generating layer (n-CGL) and a p-type charge-generating layer (p-CGL). The n-type charge-generating layer (n-CGL) may supply electrons to the first common layer 221 and the lower emission layer 222a. The p-type charge-generating layer (p-CGL) may supply holes to the upper emission layer 222b and the second common layer 223.

The n-type charge-generating layer (n-CGL) may include an n-type dopant material and an n-type host material. The n-type dopant material may include a metal in Group I and Group II of the periodic table, an organic material into which electrons may be injected, a mixture thereof, or a compound thereof. For example, the n-type dopant material may be one of an alkali metal and an alkaline earth metal. For example, though the n-type charge-generating layer (n-CGL) may include an organic layer doped with an alkali metal such as lithium (Li), sodium (Na), potassium (K), or cesium (Cs), or an alkaline earth metal such as magnesium (Mg), strontium (Sr), barium (Ba), radium (Ra), an alloy thereof, and mixture thereof. However, the embodiment is not limited thereto. Though the n-type host material may include a material that may transfer electrons, for example, at least one of Alq3 (tris(8-hydroxyquinolino)aluminum), Liq (8-hydroxyquinolinato-lithium), PBD (2-(4-biphenylyl)-5-(4-tert-butylphenyl)-1,3,4oxadiazole), TAZ (3-(4-biphenyl) 4-phenyl-5-tert-butylphenyl-1,2,4-triazole), spiro-PBD, and BAlq (bis(2-methyl-8-quinolinolate)-4-(phenylphenolato)aluminium), SAlq, TPBi (2,2',2-(1,3,5-benzinetriyl)-tris(1-phenyl-1-H-benzimidazole), oxadiazole, triazole, phenanthroline, benzoxazole, and benzothiazole, the embodiment is not limited thereto.

The p-type charge-generating layer (p-CGL) may include a p-type dopant material and a p-type host material. Though the p-type dopant material may include at least one organic material such as metal oxide, tetrafluoro-tetracyanoquinodimethane (F4-TCNQ), HAT-CN (Hexaazatriphenylene-hexacarbonitrile), hexaazatriphenylene, or a metal material such as $V_2O_5$, $MoO_x$, and $WO_3$, the embodiment is not limited thereto. Though the p-type host material may include a material that may transfer holes, for example, at least one of NPD (N,N-dinaphthyl-N,N'-diphenyl benzidine) (N,N'-bis(naphthalene-1-yl)-N,N'-bis(phenyl)-2,2'-dimethylbenzidine), TPD (N,N'-diphenyl-N,N'-bis(3-methylphenyl)-1,1'-bi-phenyl-4,4'-diamine), and MTDATA (4,4',4-Tris(N-3-methylphenyl-N-phenyl-amino)-triphenylamine), the embodiment is not limited thereto.

The thin-film encapsulation layer TFE may be arranged on the organic light-emitting diode OLED. Though it is illustrated in FIGS. 4 and 5 that the thin-film encapsulation layer TFE is arranged in the display area DA, the thin-film encapsulation layer TFE may be arranged also in a portion of the peripheral area NDA.

The thin-film encapsulation layer TFE may include first and second inorganic encapsulation layers 310 and 330, and an organic encapsulation layer 320. As an example, the thin-film encapsulation layer TFE may include the first inorganic encapsulation layer 310, the organic encapsulation layer 320, and the second inorganic encapsulation layer 330 that are sequentially stacked. Each of the first and second inorganic encapsulation layers 310 and 330 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. Each of the first and second inorganic encapsulation layers 310 and 330 may be formed by a chemical vapor deposition (CVD) process.

The organic encapsulation layer 320 may include at least one material selected from among a methacryl-based resin, a polyisoprene, a vinyl-based resin, an epoxy-based resin, a urethane-based resin, a cellulose-based resin, and a perylene-based resin. In an embodiment, the organic encapsulation layer 320 may be formed by an atomic layer deposition (ALD) process that uses a material such as hexamethyldisiloxane (HMDSO) or tetraethyl orthosilicate (TEOS) as a material gas. In another embodiment, the organic encapsulation layer 320 may be formed by depositing liquid monomer and hardening the deposited liquid monomer by using heat or light such as an ultraviolet ray.

Though the embodiment describes the case where the thin-film encapsulation layer TFE includes two of the first and second inorganic encapsulation layers 310 and 330 and one organic encapsulation layer 320, the stacking order of the inorganic encapsulation layers and the organic encapsulation layers and the number of inorganic encapsulation layers and the number of organic encapsulation layers are not limited thereto.

Figure 6:
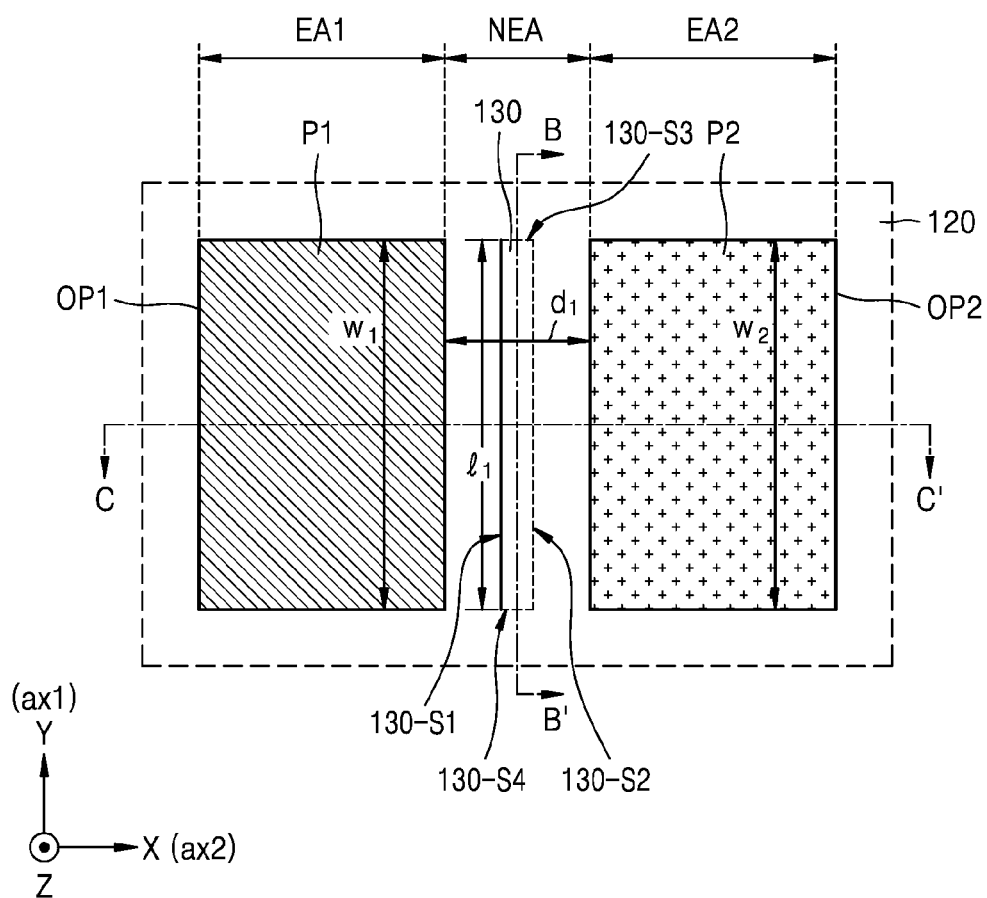
FIG. 6 is a schematic plan view of a portion of a display area of a display apparatus according to an embodiment.

FIG. 6 is a schematic plan view of a portion of a display area of a display apparatus according to an embodiment.

Referring to FIG. 6, pixels (e.g., first and second pixels P1 and P2) may be arranged adjacent to each other in a display area DA (e.g., refer to FIG. 1). Though it is illustrated in FIG. 6 that the pixels, that is, the first and second pixels P1 and P2 have the same area and are parallel to each other, the embodiment is not limited thereto. The first pixel P1 and the second pixel P2 may be adjacent to each other and may emit light of different colors. As an example, the first pixel P1 may emit green light, and the second pixel P2 may emit blue light. A first emission area EAl of the first pixel P1 emitting the green light may be smaller than a second emission area EA2 of the second pixel P2 emitting the blue light.

The pixels (e.g., the first and second pixels P1 and P2) may be defined to correspond to openings OP1 and OP2 of a pixel-defining layer 120. The display area DA may include a first emission area EAl of the first pixel P1, a second emission area EA2 of the second pixel P2, and a non-emission area NEA disposed between the first emission area EA1 and the second emission area EA2.

A structural layer 130 may be arranged on a portion of the pixel-defining layer 120 between the first pixel P1 and the second pixel P2. For example, the structural layer 130 may be arranged in the non-emission area NEA between the pixels (e.g., the first and second pixels P1 and P2).

The structural layer 130 may have an upper surface 130-US (e.g., refer to FIG. 9B), a first lateral surface 130-S1, and a second lateral surface 130-S2. The upper surface 130-US (e.g., refer to FIG. 9B) may protrude from the pixel-defining layer 120. The first lateral surface 130-S1 may be connected (e.g., extended) to the upper surface 130-US (e.g., refer to FIG. 9B) and have a slope tapered in a reverse direction. The second lateral surface 130-S2 may have a slope tapered in a forward direction. In an embodiment, the structural layer 130 may have a quadrangular shape arranged in a first direction ax1 (e.g., a y-direction) parallel to a side of the first pixel P1. The structural layer 130 may include four lateral sides (e.g., first, second, third, and fourth lateral sides 130-S1, 130-S2, 130-S3, and 130-S4) connected (e.g., extended) along four sides of the upper surface 130-US (e.g., refer to FIG. 8A). This is described in detail with reference to FIGS. 7A to 7D and 8A to 8D.

A length $l_1$ of the structural layer 130 in the first direction ax1 may be equal to or greater than one of a width $w_1$ of the first emission area EA1 of the first pixel P1 and a width $w_2$ of a second emission area EA2 of the second pixel P2 in the first direction ax1. In an embodiment, the width $w_1$ of the first emission area EA1 of the first pixel P1 in the first direction ax1 may be greater than the width $w_2$ of a second emission area EA2 of the second pixel P2 in the first direction ax1. The length $l_1$ of the structural layer 130 in the first direction ax1 may be equal to or greater than the width $w_1$ of the first emission area EA1 of the first pixel P1 in the first direction ax1.

In an embodiment, the structural layer 130 may include an organic material or an inorganic material. In another embodiment, the structural layer 130 may include the same material as that of the pixel-defining layer 120. As an example, the structural layer 130 may be formed by patterning the upper portion of the pixel-defining layer 120.

The structural layer 130 may be formed by firstly exposing lateral surfaces each having a slope tapered in a reverse direction and secondly exposing lateral surfaces each having a slope tapered in a forward direction. The order of the firstly exposure and the secondly exposure may be changed. A mask for the exposure may be a half-tone mask. In another embodiment, the structural layer 130 may be formed by applying laser scan exposure technology. However, the embodiment is not limited thereto.

Figure 9A:
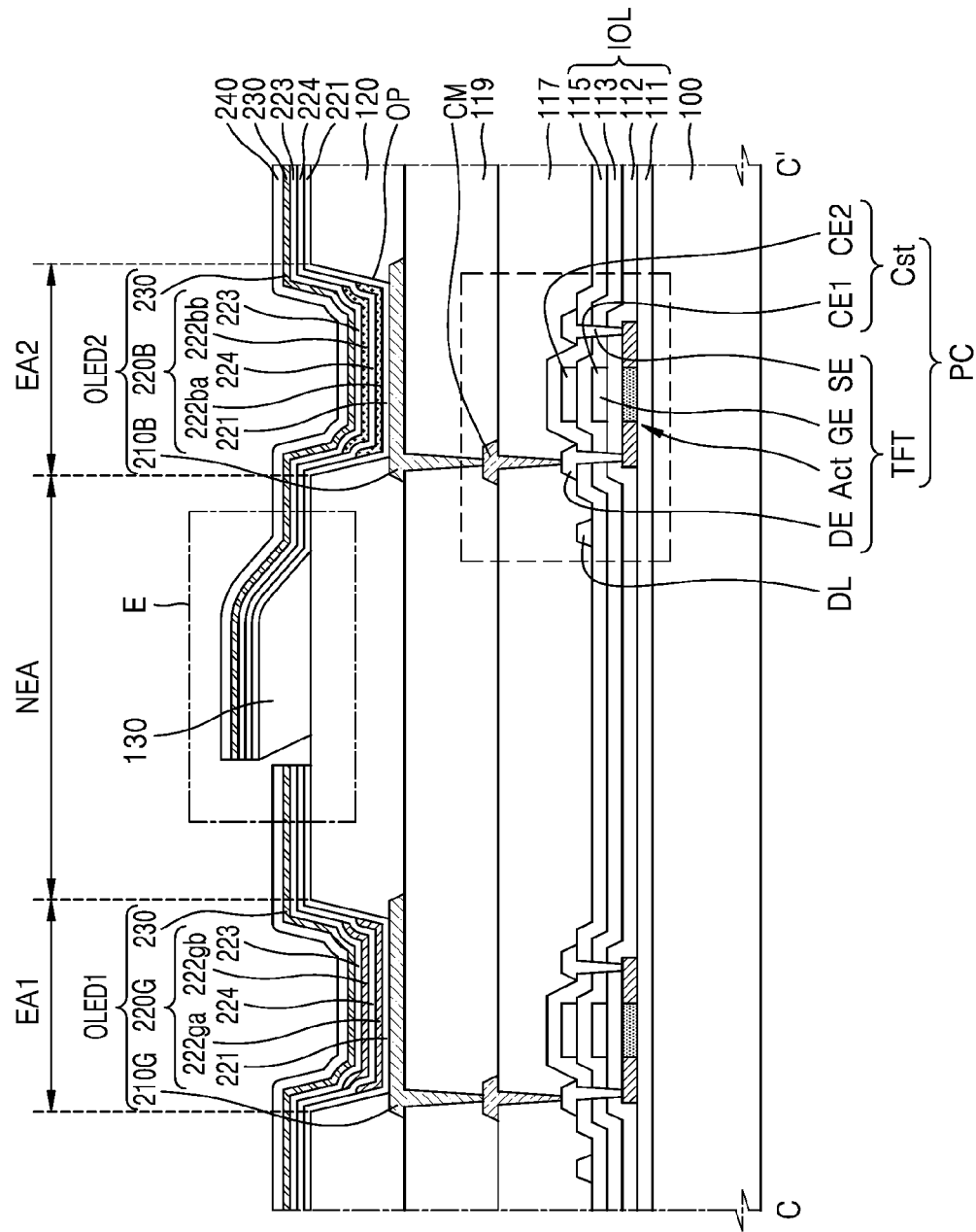
FIG. 9A is a schematic cross-sectional view of the display apparatus shown in FIG. 6, taken along line C-C' of FIG. 6.

The first pixel P1 and the second pixel P2 may include first and second common layers 221 and 223 (e.g., refer to FIG. 9A), a charge-generating layer 224 (e.g., refer to FIG. 9A), and an opposite electrode 230 (e.g., refer to FIG. 9A). Each of the first and second common layers 221 and 223 (e.g., refer to FIG. 9A), the charge-generating layer 224 (e.g., refer to FIG. 9A), and the opposite electrode 230 (e.g., refer to FIG. 9A) may be provided as single bodies in the pixels (e.g., first and second pixels P1 and P2). Each of the first and second common layers 221 and 223 (e.g., refer to FIG. 9A), the charge-generating layer 224 (e.g., refer to FIG. 9A), and the opposite electrode 230 (e.g., refer to FIG. 9A) may include a discontinuous portion da (e.g., refer to FIG. 9B) disconnected by first lateral surface 130-S1). Since electrical conductivity of the first and second common layers 221 and 223 (e.g., refer to FIG. 9A), the charge-generating layer 224 (e.g., refer to FIG. 9A), and the opposite electrode 230 (e.g., refer to FIG. 9A) is reduced in the discontinuous portion da (e.g., refer to FIG. 9B), a leakage current in a second direction ax2 does not occur and partial electrical disconnection occurs between the first pixel P1 and the second pixel P2 adjacent to each other.

The first and second common layers 221 and 223 (e.g., refer to FIG. 9B), the charge-generating layer 224 (e.g., refer to FIG. 9B), and the opposite electrode 230 (e.g., refer to FIG. 9B), which are disposed on the upper surface 130-US (e.g., refer to FIG. 8A) of the structural layer 130, may be gently connected (e.g., extended) to the first and second common layers 221 and 223 (e.g., refer to FIG. 9B), the charge-generating layer 224 (e.g., refer to FIG. 9B), and the opposite electrode 230 (e.g., refer to FIG. 9B), which are disposed on the upper surface 120-US (e.g., refer to FIG. 9B) of the pixel-defining layer 120 by the second lateral surface 130-S2. For example, portions of the first and second common layers 221 and 223 (e.g., refer to FIG. 9A), a portion of the charge-generating layer 224 (e.g., refer to FIG. 9A), and a portion of the opposite electrode 230 (e.g., refer to FIG. 9A), which are disposed on the upper surface 130-US (e.g., refer to FIG. 8A) in the non-emission area NEA may be gently connected to and provided as a single body with (e.g., be integral with) another portions of the first and second common layers 221 and 223 (e.g., refer to FIG. 9A), another portion of the charge-generating layer 224 (e.g., refer to FIG. 9A), and another portion of the opposite electrode 230 (e.g., refer to FIG. 9A), which is disposed on the upper surface 120-US (e.g., refer to FIG. 9B) in the non-emission area NEA, respectively. Accordingly, loss in the area of the opposite electrode 230 may be reduced (or minimized), and a voltage drop (e.g., IR drop) due to an increase in the resistance of the opposite electrode 230 may be prevented.

In some display apparatuses, as a distance di between pixels (e.g., the first pixel P1 and the second pixel P2) decreases due to high resolution, a current applied to a pixel (e.g., the first pixel P1) may leak along the common layers (e.g., the first and second common layers 221 and 223 of FIG. 9A) and the charge-generating layer 224 (e.g., refer to FIG. 9A) of the intermediate layer 220B or 220G (e.g., refer to FIG. 9A). Thus, the second pixel P2 adjacent to the first pixel P1 may emit light, and colors of the first and second pixels P1 and P2 may be mixed with each other. In the embodiment of FIG. 6, since the structural layer 130 may be arranged between the pixels (e.g., the first pixel P1 and the second pixel P2) adjacent to each other, a leakage current (e.g., leakage current in lateral direction) and color mixture between adjacent ones of the pixels (e.g., first and second pixels P1 and P2) may be prevented, and loss in the area of the opposite electrode 230 may be minimized. Therefore, the display quality of the display apparatus may be improved.

FIGS. 7A to 7D are schematic plan views of structural layers shown in FIG. 6, and FIGS. 8A to 8D are schematic cross-sectional views of structural layers according to an embodiment, taken along line B-B' of FIG. 6.

Figure 7A:
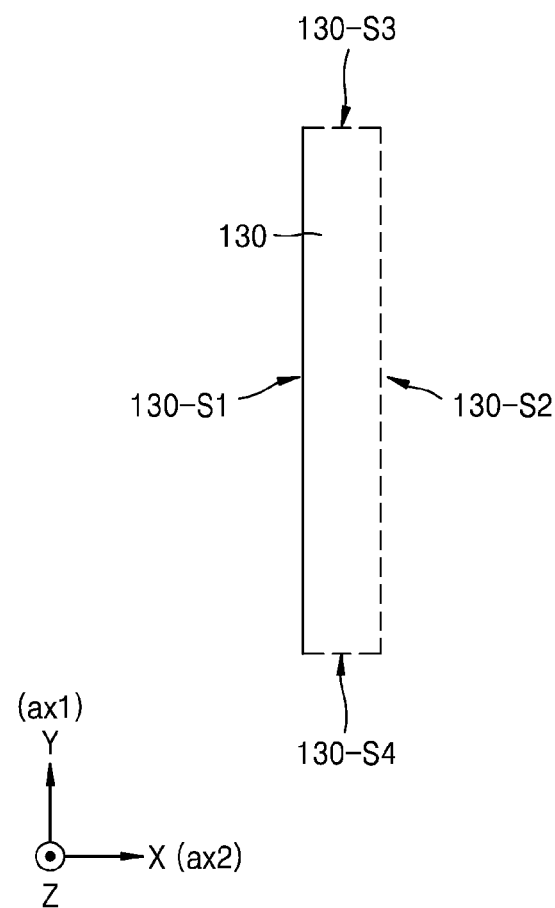
FIGS. 7A to 7D are schematic plan views of structural layers shown in FIG. 6.
Figure 8A:
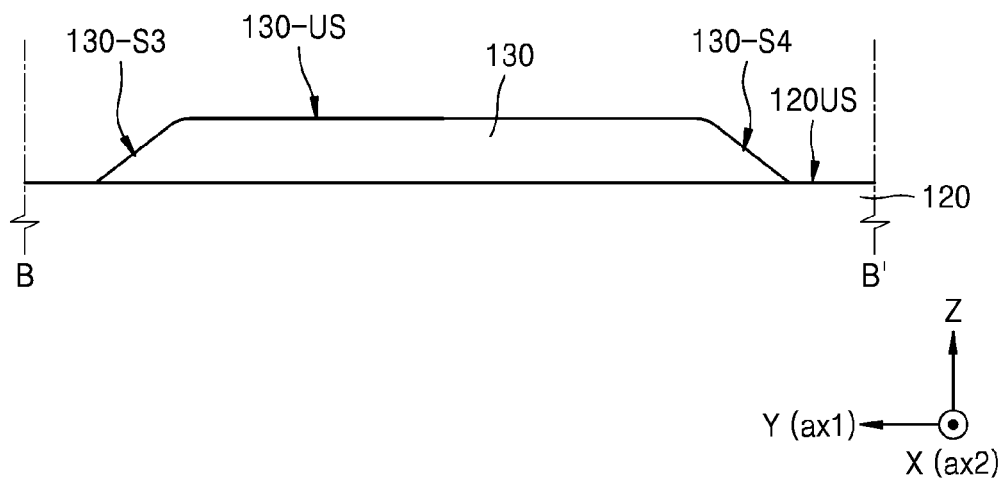
FIGS. 8A to 8D are schematic cross-sectional views of structural layers shown in FIG. 6, taken along line B-B' of FIG. 6.
Figure 8B:
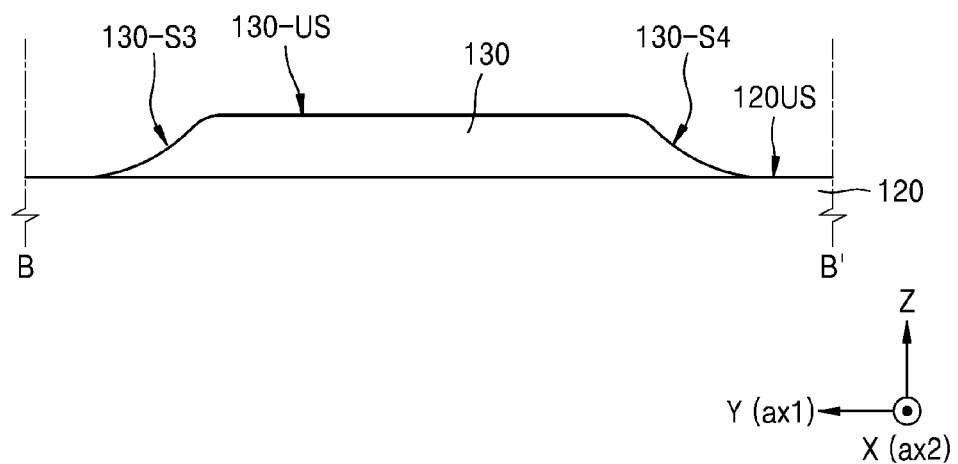

Referring to FIGS. 7A, 8A, and 8B, a structural layer 130 according to an embodiment may be arranged in a first direction ax1 (e.g., a y-direction) and connected (e.g., extended) to an upper surface 130-US of the structural layer 130. The structural layer 130 may include a first lateral surface 130-S1 and a second lateral surface 130-S2. The first lateral surface 130-S1 may have a slope tapered in a reverse direction, and the second lateral surface 130-S2 may have a slope tapered in a forward direction.

The structural layer 130 may include a third lateral surface 130-S3 and a fourth lateral surface 130-S4. Each of the third lateral surface 130-S3 and the fourth lateral surface 130-S4 may be connected (or extended) to the upper surface 130-US of the structural layer 130 and have a slope tapered in a forward direction. The third lateral surface 130-S3 and the fourth lateral surface 130-S4 may be arranged in the second direction ax2 (e.g., the x-direction). In an embodiment, each of the third lateral surface 130-S3 and the fourth lateral surface 130-S4 may have a slope tapered in a forward direction and a flat surface, as shown in FIG. 8A. In another embodiment, the third lateral surface 130-S3 and the fourth lateral surface 130-S4 may be an uneven curved surface, as shown in FIG. 8B.

Figure 7B:
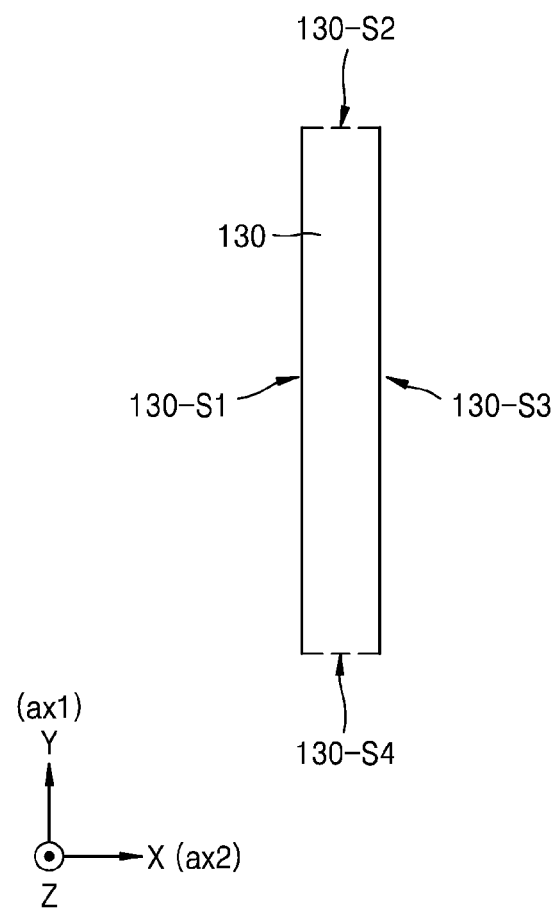

Referring to FIG. 7B, in another embodiment, a structural layer 130 may include a first lateral surface 130-S1, a second lateral surface 130-S2, a third lateral surface 130-S3, and a fourth lateral surface 130-S4. Each of the first lateral surface 130-S1 and the third lateral surface 130-S3 may be connected (e.g., extended) to an upper surface 130-US of the structural layer and have a slope tapered in a reverse direction. Each of the second lateral surface 130-S2 and the fourth lateral surface 130-S4 may be connected (e.g., extended) to the upper surface 130-US of the structural layer 130 and have a slope tapered in a forward direction. The first lateral surface 130-S1 and the third lateral surface 130-S3 may be arranged in the first direction ax1, and the second lateral surface 130-S2 and the fourth lateral surface 130-S4 may be arranged in a second direction ax2.

Figure 7C:
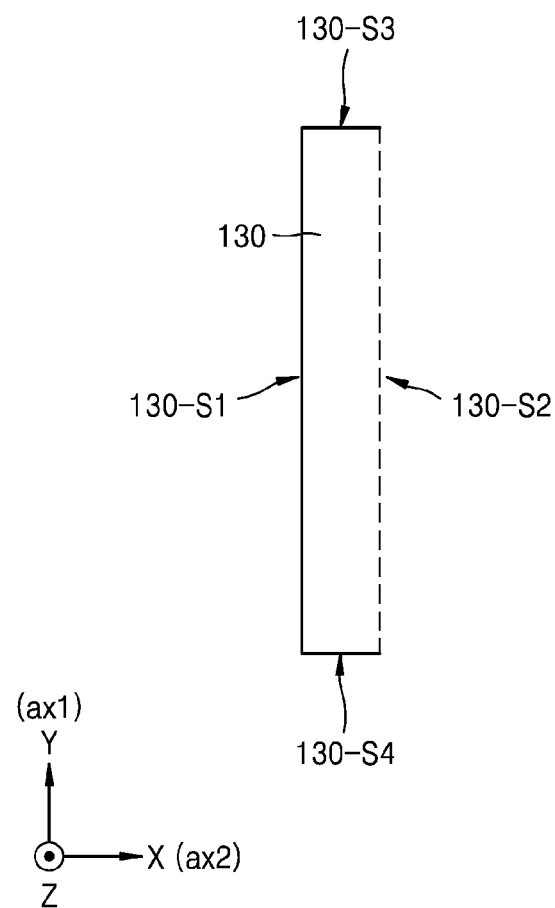
Figure 8C:
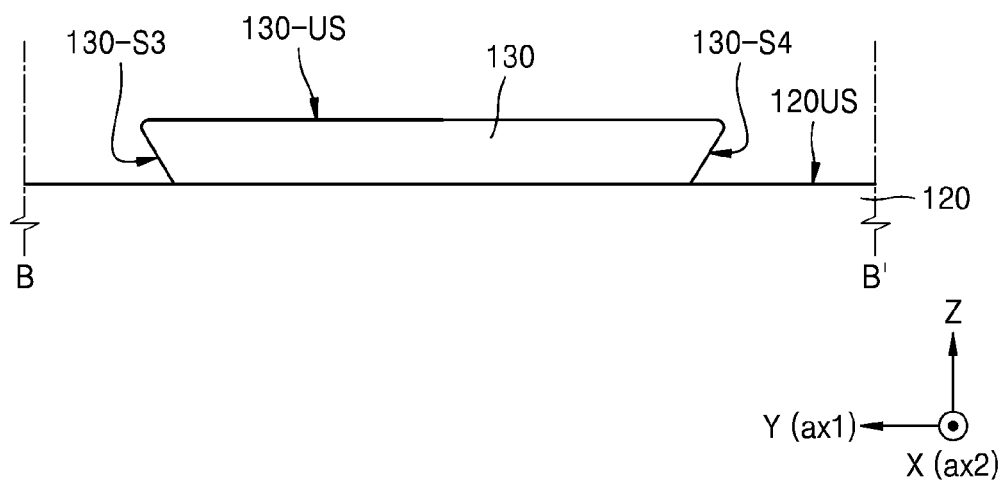

Referring to FIGS. 7C and 8C, in another embodiment, a structural layer 130 may include a first lateral surface 130-S1 and a second lateral surface 130-S2. Each of the first lateral surface 130-S1 and the second lateral surface 130-S2 may be arranged in a first direction ax1 and connected (e.g., extended) to an upper surface 130-US of the structural layer 130. The first lateral surface 130-S1 may have a slope tapered in a reverse direction, and the second lateral surface 130-S2 may have a slope tapered in a forward direction. The structural layer 130 may include a third lateral surface 130-S3 and a fourth lateral surface 130-S4. Each of the third lateral surface 130-S3 and the fourth lateral surface 130-S4 may be arranged in a second direction ax2, and connected (e.g., extended) to the upper surface 130-US of the structural layer 130. Each of the third lateral surface 130-S3 and the fourth lateral surface 130-S4 may have a slope tapered in a reverse direction. As an example, each of the first lateral surface 130-S1, the third lateral surface 130-S3, and the fourth lateral surface 130-S4 of the structural layer 130 may have a slope tapered in a reverse direction, and only the second lateral surface 130-S2 may have a slope tapered in a forward direction.

Figure 7D:
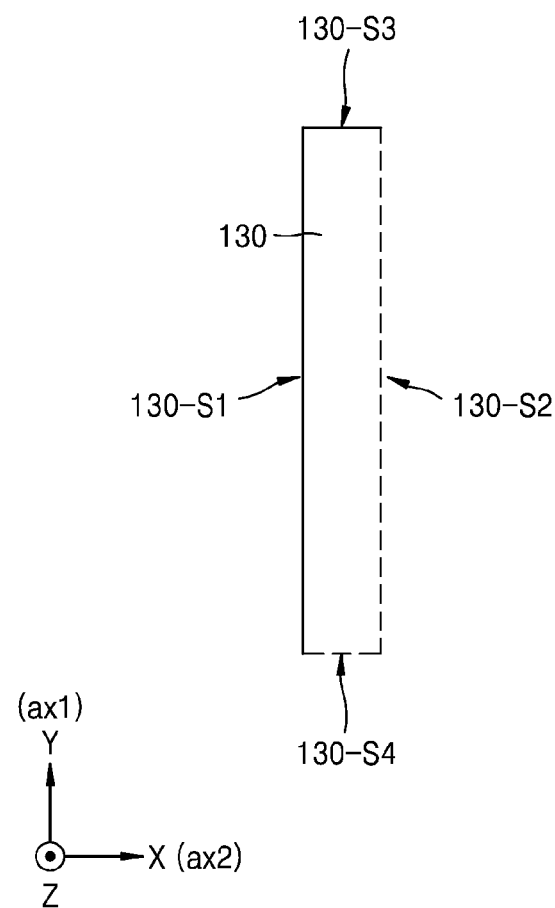
Figure 8D:
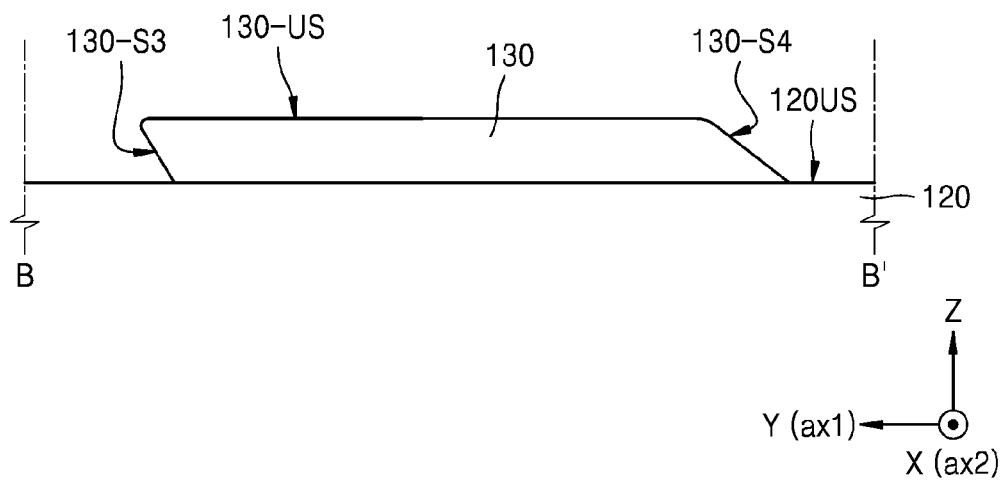

Referring to FIGS. 7D and 8D, in an embodiment, a structural layer 130 may include a first lateral surface 130-S1 and a second lateral surface 130-S2. Each of the first lateral surface 130-S1 and the second lateral surface 130-S2 may be arranged in a first direction ax1 and connected (e.g., extended) to an upper surface 130-US of the structural layer 130. The first lateral surface 130-S1 may have a slope tapered in a reverse direction, and the second lateral surface 130-S2 may have a slope tapered in a forward direction. The structural layer 130 may include a third lateral surface 130-S3 and a fourth lateral surface 130-S4. Each of the third lateral surface 130-S3 and the fourth lateral surface 130-S4 may be arranged in a second direction ax2, and connected (e.g., extended) to the upper surface 130-US of the structural layer 130. The third lateral surface 130-S3 may have a slope tapered in a reverse direction, and the fourth lateral surface 130-S4 may have a slope tapered in a forward direction. For example, the first lateral surface 130-S1 and the third lateral surface 130-S3 may be connected (e.g., extended) to each other. Each of the first lateral surface 130-S1 and the third lateral surface 130-S3 may have a slope tapered in a reverse direction. For example, the second lateral surface 130-S2 and the fourth lateral surface 130-S4 may be connected (e.g., extended) to each other. Each of the second lateral surface 130-S2 and the fourth lateral surface 130-S4 may have the slope tapered in the forward direction.

In the embodiments, the structural layer 130 may include at least one first lateral surface 130-S1 and at least one second lateral surface 130-S2. Each of the at least one first lateral surface 130-S1 and the at least one second lateral surface 130-S2 may be connected (e.g., extended) to the upper surface 130-US of the structural layer 130. The at least one first lateral surface 130-S1 may have a slope tapered in a reverse direction. The at least one second lateral surface 130-S2 may have a slope tapered in a forward direction. The lateral surfaces having the slope tapered in the forward direction may be flat surfaces or uneven surfaces.

Figure 9B:
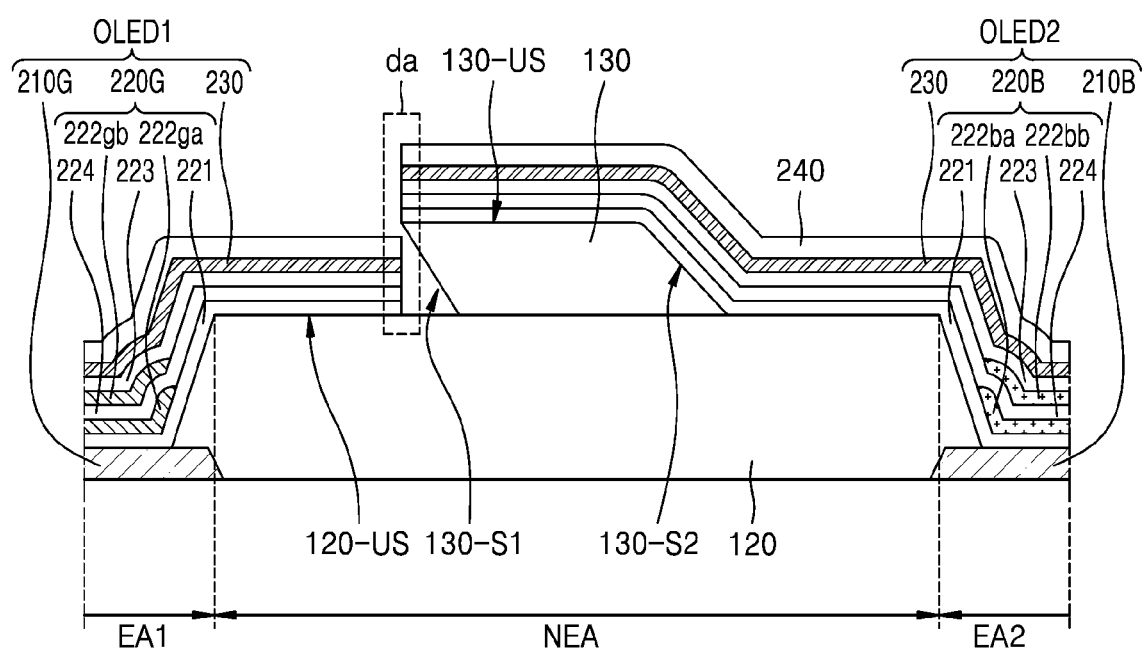
FIG. 9B is a schematic enlarged view of a portion E of the display apparatus shown in FIG. 9A.

FIG. 9A is a schematic cross-sectional view of the display apparatus shown in FIG. 6, taken along line C-C' of FIG. 6, and FIG. 9B is a schematic enlarged view of a portion E of the display apparatus shown in FIG. 9A.

The constructions of first and second organic light-emitting diodes OLED1 and OLED2 and the pixel circuit PC of FIGS. 9A and 9B may be substantially identical or similar to those of the organic light-emitting diode OLED and the pixel circuit PC of FIG. 5, and thus repetitive descriptions thereof are omitted.

Referring to FIGS. 9A and 9B, the display apparatus 1 (e.g., refer to FIG. 1) according to an embodiment may include organic light-emitting diodes (e.g., the first and second organic light-emitting diodes OLED1 and OLED2) adjacent to each other.

In an embodiment, each of the first and second organic light-emitting diodes OLED1 and OLED2 may have a tandem structure including multiple emission layers. In another embodiment, each of the first and second organic light-emitting diodes OLED1 and OLED2 may include a single emission layer as shown in FIG. 4.

In an embodiment, each of a first intermediate layer 220G and a second intermediate layer 220B may include the multiple emission layers inside the organic light-emitting diode. For example, the first and second intermediate layers 220G and 220B may respectively include first and second lower emission layers 222ga and 222ba and first and second upper emission layers 222gb and 222bb. For example, the first and second lower emission layers 222ga and 222ba may respectively overlap the first and second upper emission layers 222gb and 222bb in a plan view. The first and second lower emission layers 222ga and 222ba and the first and second upper emission layers 222gb and 222bb may be patterned for each of the first and second organic light-emitting diodes OLED1 and OLED2. For example, the first lower emission layer 222ga and the first upper emission layer 222gb may be patterned for the first organic light-emitting diode OLED1, and the second lower emission layer 222ba and the second upper emission layer 222bb may be patterned for the second organic light-emitting diode OLED2. The first lower emission layer 222ga may be separated from the second lower emission layer 222ba, and the first upper emission layer 222gb may be separated from the second upper emission layer 222bb.

Each of the first and second organic light-emitting diodes OLED1 and OLED2 may emit red, green, blue, or white light. Each of the first and second lower emission layers 222ga and 222ba and the first and second upper emission layers 222gb and 222bb may emit red, green, or blue light. In an embodiment, the first and second organic light-emitting diodes OLED1 and OLED2 may emit light of different colors. As an example, the first organic light-emitting diode OLED1 may emit green light, and the second organic light-emitting diode OLED2 may emit blue light. In case that the first organic light-emitting diode OLED1 emits green light, the first lower emission layer 222ga may emit green light, and the first upper emission layer 222gb may equally emit green light. For example, the first lower emission layer 222ga and the first upper emission layer 222gb may emit green light. In case that the second organic light-emitting diode OLED2 emits blue light, the second lower emission layer 222ba may emit blue light, and the second upper emission layer 222bb may equally emit blue light. For example, the second lower emission layer 222ba and the second upper emission layer 222bb may emit blue light.

The first and second organic light-emitting diodes OLED1 and OLED2 may include a first pixel electrode 210G, a second pixel electrode 210B, a first common layer 221, and a second common layer 223. The first common layer 221 may be disposed between the first lower emission layer 222ga and first pixel electrode 210G and between the second lower emission layer 222ba and the second pixel electrode 210B. The second common layer 223 may be disposed between the first upper emission layer 222gb, the second upper emission layer 222bb, and the opposite electrode 230. In an embodiment, the first common layer 221 may include a hole injection layer (HIL) and a hole transport layer (HTL), and the second common layer 223 may include an electron transport layer (ETL) and an electron injection layer (EIL). In another embodiment, at least one of the hole injection layer (HIL), the hole transport layer (HTL), the electron transport layer (ETL), and the electron injection layer (EIL) may be omitted.

In an embodiment, a charge-generating layer 224 may be arranged between the first lower emission layers 222ga and the first upper emission layer 222gb and between the second lower emission layers 222ba and the second upper emission layer 222bb. For example, the charge-generating layer 224 may be provided in common over the first and second organic light-emitting diodes OLED1 and OLED2.

A pixel-defining layer 120 may include an opening OP exposing each of upper surfaces of the first pixel electrode 210G and the second pixel electrode 210B. The pixel-defining layer 120 may cover (or overlap) edges of each of the first pixel electrode 210G and the second pixel electrode 210B. First and second emission areas EA1 and EA2 of the first and second organic light-emitting diodes OLED1 and OLED2 may be defined by the opening OP of the pixel-defining layer 120. The non-emission area NEA may be provided between the first and second organic light-emitting diodes OLED1 and OLED2. The non-emission area NEA may be substantially a region between the first and second emission areas EA1 and EA2.

A structural layer 130 may be provided on the pixel-defining layer 120. The structural layer 130 may include an upper surface 130-US, a first lateral surface 130-S1, and a second lateral surface 130-S2. Each of the first lateral surface 130-S1 and the second lateral surface 130-S2 may be connected (e.g., extended) to the upper surface 130-US. The first lateral surface 130-S1 may have a slope tapered in a reverse direction, and the second lateral surface 130-S2 may have a slope tapered in a forward direction.

In an embodiment, the structural layer 130 may include an organic material, an inorganic material, or a mixture thereof. In an embodiment, the structural layer 130 and the pixel-defining layer 120 may include a same material. As an example, the structural layer 130 and the pixel-defining layer 120 may be provided as one body (or may be integral with each other).

Each of the first and second common layers 221 and 223, the charge-generating layer 224, and the opposite electrode 230 may be provided as a single body on the first and second organic light-emitting diodes OLED1 and OLED2. For example, portions of the first and second common layers 221 and 223, a portion of the charge-generating layer 224, and a portion of the opposite electrode 230, which are disposed on the first organic light-emitting diode OLED1, may be integral with another portions of the first and second common layers 221 and 223, another portion of the charge-generating layer 224, and another portion of the opposite electrode 230, which are disposed on the second organic light-emitting diode OLED2, respectively. The first and second common layers 221 and 223, the charge-generating layer 224, and the opposite electrode 230 may have a discontinuous portion da, which is disconnected by the first lateral surface 130-S1 of the structural layer 130. Accordingly, the first and second common layers 221 and 223, the charge-generating layer 224, and the opposite electrode 230 may be disconnected by the discontinuous portion da in the second direction ax2 (e.g., x-direction), in which a leakage current flowing in the second direction ax2 (e.g., the x-direction) along the first and second common layers 221 and 223 and the charge-generating layer 224 may not occur.

For example, a partial electrical disconnection may be formed between the first and second organic light-emitting diodes OLED1 and OLED2.

The first and second common layers 221 and 223, the charge-generating layer 224, and the opposite electrode 230, which are disposed on the upper surface 130-US of the structural layer 130, may be gently connected (e.g., extended) to the first and second common layers 221 and 223, the charge-generating layer 224, and the opposite electrode 230, which are disposed on the upper surface 120-US of the pixel-defining layer 120, by the second lateral surface 130-S2, respectively. For example, portions of the first and second common layers 221 and 223, a portion of the charge-generating layer 224, and a portion of the opposite electrode 230, which are disposed on the upper surface 130-US of the structural layer 130, may be gently connected to and provided as a single body with (e.g., integral with) another portions of the first and second common layers 221 and 223, another portion of the charge-generating layer 224, and another portion of the opposite electrode 230, which are disposed on the upper surface 120-US of the pixel-defining layer 120, respectively. The second lateral surface 130-S2 may be disposed between the upper surface 130-US of the structural layer 130 and the upper surface 120-US of the pixel-defining layer 120. Accordingly, the second lateral surface 130-S2 may prevent disconnection (e.g., complete disconnection) of a portion of the opposite electrode 230 on the upper surface 130-US of the structural layer 130 from another portion of the opposite electrode 230 on the upper surface 120-US of the pixel-defining layer 120, and the area of the opposite electrode 230 may not be reduced. For example, the size of the opposite electrode 230 may be maximized by the second lateral surface 130-S2.

Figure 10:
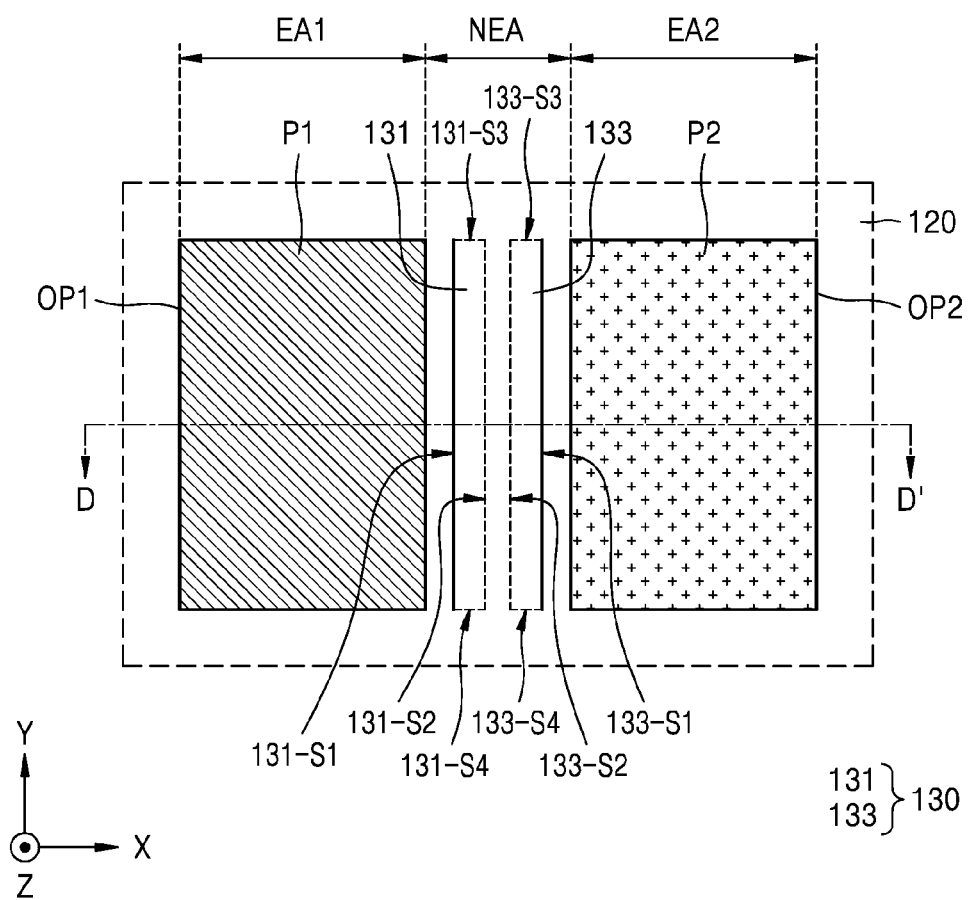
FIG. 10 is a schematic plan view of a portion of a display area of a display apparatus according to an embodiment.

FIG. 10 is a schematic plan view of a portion of a display area of a display apparatus according to an embodiment.

FIG. 10 is similar to FIG. 6 but is different from FIG. 6 at least in that the structural layer 130 includes a first sub-structural layer 131 and a second sub-structural layer 133. Hereinafter, repetitive descriptions are omitted and differences of the structural layer 130 are mainly described.

Referring to FIG. 10, the structural layer 130 may include the first sub-structural layer 131 and the second sub-structural layer 133 parallel to each other and spaced apart from each other. The first sub-structural layer 131 and the second sub-structural layer 133 may be disposed between the first pixel P1 and the second pixel P2.

The first sub-structural layer 131 may include a first upper surface 131-US (e.g., refer to FIG. 12A), a (1-1)st lateral surface 131-S1, and a (1-2)nd lateral surface 131-S2. Each of the (1-1)st lateral surface 131-S1 and the (1-2)nd lateral surface 131-S2 may be connected (e.g., extended) to the first upper surface 131-US (e.g., refer to FIG. 12A). The (1-1)st lateral surface 131-S1 may have a slope tapered in a reverse direction. The (1-2)nd lateral surface 131-S2 may have a slope tapered in a forward direction.

The second sub-structural layer 133 may include a second upper surface 133-US (e.g., refer to FIG. 12A), a (2-1)st lateral surface 133-S1, and a (2-2)nd lateral surface 133-S2. Each of the (2-1)st lateral surface 133-S1 and the (2-2)nd lateral surface 133-S2 may be connected (e.g., extended) to the second upper surface 133-US (e.g., refer to FIG. 12A). The (2-1)st lateral surface 133-S1 may have a slope tapered in a reverse direction, and the (2-2)nd lateral surface 133-S2 may have a slope tapered in a forward direction.

In an embodiment, each of the first and second sub-structural layers 131 and 133 may have a quadrangular shape arranged in the first direction ax1 (e.g., the y-direction) parallel to a side of the first pixel P1. A length of the first sub-structural layer 131 in the first direction ax1 (e.g. y-direction) may be the same as or different from a length of the second sub-structural layer 133 in the first direction ax1 (e.g., y-direction). In an embodiment, the lengths of the first and second sub-structural layers 131 and 133 in the first direction ax1 (e.g., y-direction) may be the same as or greater than a width of the first pixel P1 in the first direction ax1 (e.g. y-direction).

In an embodiment, each of the first and second sub-structural layers 131 and 133 may include an organic material, an inorganic material, or a mixture thereof. In another embodiment, each of the first and second sub-structural layers 131 and 133 may include the same material as that of the pixel-defining layer 120. As an example, the first and second sub-structural layers 131 and 133 may be formed by patterning the upper portion of the pixel-defining layer 120. As an example, the first and second sub-structural layers 131 and 133 may be formed by firstly exposing the lateral surfaces each having a slope tapered in a reverse direction, and secondly exposing the lateral surfaces each having a slope tapered in a forward direction. A mask for exposure may include a half-tone mask. In another embodiment, the first and second sub-structural layers 131 and 133 may be formed by laser scan exposure technology. However, the embodiment is not limited thereto.

Figure 11:
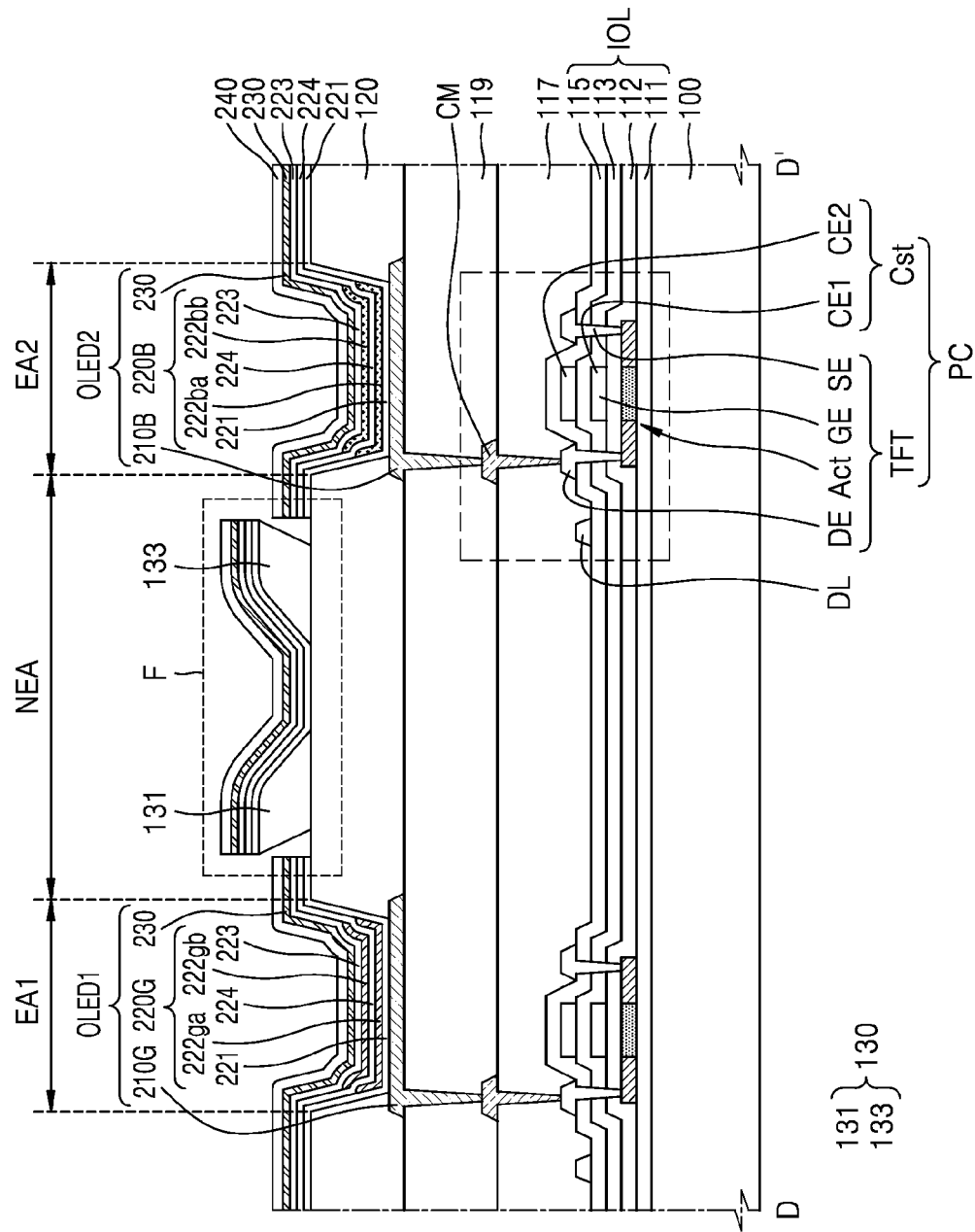
FIG. 11 is a schematic cross-sectional view of the display apparatus shown in FIG. 10, taken along line D-D' of FIG. 10.

FIG. 11 is a schematic cross-sectional view of the display apparatus shown in FIG. 10, taken along line D-D' of FIG. 10, and FIGS. 12A to 12E are schematic enlarged views of a portion of the display apparatus shown in FIG. 11.

FIG. 11 is similar to FIG. 9A but is different from FIG. 9A at least in that the structural layer 130 includes the first sub-structural layer 131 and the second sub-structural layer 133. Hereinafter, repetitive descriptions are omitted and differences of the structural layer 130 are mainly described.

Figure 12A:
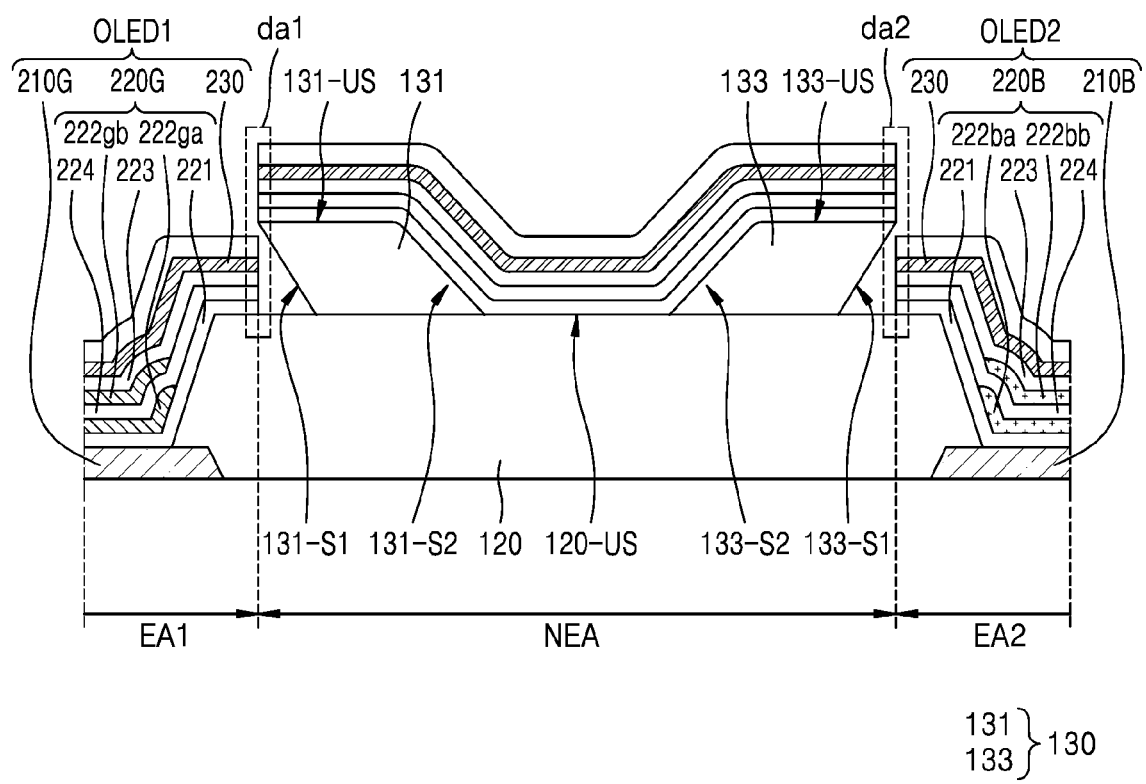
FIGS. 12A to 12E are schematic enlarged views of a portion F of the display apparatus shown in FIG. 11.

Referring to FIGS. 11 and 12A, the display apparatus 1 (e.g., refer to FIG. 1) according to an embodiment may include organic light-emitting diodes (e.g., the first organic light-emitting diode OLED1 and the second organic light-emitting diode OLED2) adjacent to each other.

A pixel-defining layer 120 may include an opening OP exposing each of upper surfaces of a first pixel electrode 210G and a second pixel electrode 210B. The pixel-defining layer 120 may cover (or overlap) edges of each of the first pixel electrode 210G and the second pixel electrode 210B. First and second emission areas EA1 and EA2 of the organic light-emitting diodes (e.g., the first organic light-emitting diode OLED1 and the second organic light-emitting diode OLED2) may be defined by the opening OP of the pixel-defining layer 120. The non-emission area NEA may be provided between the organic light-emitting diodes (e.g., the first organic light-emitting diode OLED1 and the second organic light-emitting diode OLED2). The non-emission area NEA may be substantially a region between the first and second emission areas EA1 and EA2.

The first and second sub-structural layers 131 and 133 may be provided on the pixel-defining layer 120. The first sub-structural layer 131 may include a first upper surface 131-US, a (1-1)st lateral surface 131-S1, and a (1-2)nd lateral surface 131-S2. Each of the (1-1)st lateral surface 131-S1 and the (1-2)nd lateral surface 131-S2 may be connected (e.g., extended) to the first upper surface 131-US. The (1-1)st lateral surface 131-S1 may have a slope tapered in a reverse direction, and the (1-2)nd lateral surface 131-S2 may have a slope tapered in a forward direction. The second sub-structural layer 133 may include a second upper surface 133-US, a (2-1)st lateral surface 133-S1, and a (2-2)nd lateral surface 133-S2. Each of the (2-1)st lateral surface 133-S1, and the (2-2)nd lateral surface 133-S2 may be connected (e.g., extended) to the second upper surface 133-US. The (2-1)st lateral surface 133-S1 may have a slope tapered in a reverse direction, and the (2-2)nd lateral surface 133-S2 may have a slope tapered in a forward direction.

In an embodiment, the (1-1)st lateral surface 131-S1, the (1-2)nd lateral surface 131-S2, the (2-1)st lateral surface 133-S1, and the (2-2)nd lateral surface 133-S2 may be arranged in the first direction ax1 (e.g., the y-direction). The (1-2)nd lateral surface 131-S2 may face the (2-2)nd lateral surface 133-S2.

Figure 12B:
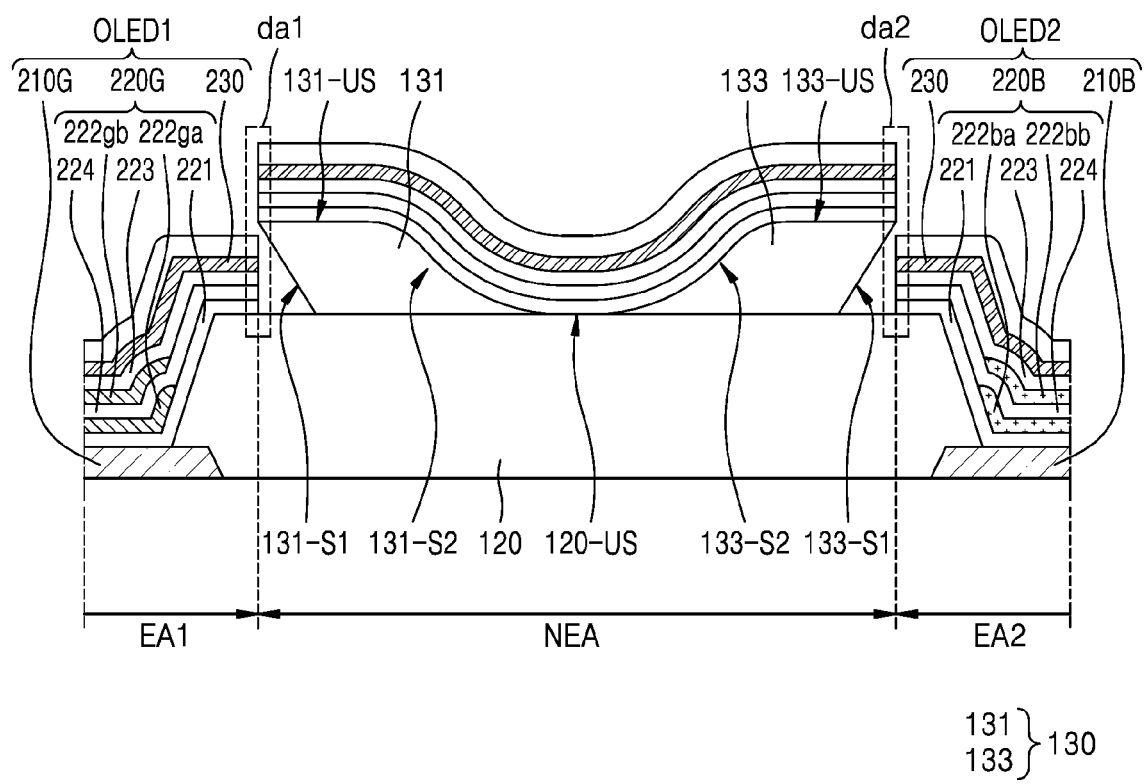

As shown in FIG. 12A, the (1-2)nd lateral surface 131-S2 and the (2-2)nd lateral surface 133-S2 may be flat surfaces. In another embodiment, as shown in FIG. 12B, a (1-2)nd lateral surface 131-S2 and a (2-2)nd lateral surface 133-S2 may be curved surfaces.

Referring again to FIGS. 11 and 12A, each of the first and second common layers 221 and 223, the charge-generating layer 224, and the opposite electrode 230 may be provided as a single body on first and second organic light-emitting diodes OLED1 and OLED2. For example, portions of the first and second common layers 221 and 223, a portion of the charge-generating layer 224, and a portion of the opposite electrode 230, which are disposed on the first organic light emitting diode OLED1, may be integral with another portions of the first and second common layers 221 and 223, another portion of the charge-generating layer 224, and another portion of the opposite electrode 230, which are disposed on the second organic light emitting diode OLED2, respectively. The first and second common layers 221 and 223, the charge-generating layer 224, and the opposite electrode 230 may include a first discontinuous portion da1 and a second discontinuous portion da2. The first discontinuous portion da1 may be disconnected by the (1-1)st lateral surface 131-S1, and the second discontinuous portion da2 may be disconnected by the (2-1)st lateral surface 133-S1. Accordingly, due to the first and second discontinuous portions da1 and da2, a leakage current flowing in the second direction ax2 (e.g., the x-direction) along the first and second common layers 221 and 223 and the charge-generating layer 224 does not occur and electrical disconnection occurs between the pixels (e.g., the first and second pixels P1 and P2 adjacent to each other).

The first and second common layers 221 and 223, the charge-generating layer 224, and the opposite electrode 230 on the first and second upper surfaces 131-US and 133-US, may be gently connected (e.g., extended) to the first and second common layers 221 and 223, the charge-generating layer 224, and the opposite electrode 230 on the upper surface 120-US of the pixel-defining layer 120 by the (1-2)nd lateral surface 131-S2 and the (2-2)nd lateral surface 133-S2. For example, portions of the first and second common layers 221 and 223, portions of the charge-generating layer 224, and portions of the opposite electrode 230, which are disposed on the first and second upper surfaces 131-US and 133-US, may be gently connected to and provided as a single body with (e.g., integral with) another portions of the first and second common layers 221 and 223, another portions of the charge-generating layer 224, and another portions of the opposite electrode 230, which are disposed on the upper surface 120-US of the pixel-defining layer 120, respectively. The (1-2)nd lateral surface 131-S2 may be disposed between the first upper surface 131-US and the upper surface 120-US of the pixel-defining layer 120, and the (2-2)nd lateral surface 133-S2 may be disposed between the second upper surface 133-US and the upper surface 120-US of the pixel-defining layer 120. Accordingly, because the opposite electrode 230 on the first and second upper surfaces 131-US and 133-US is prevented from being completely disconnected from the opposite electrode 230 on the upper surface 120-US on the pixel-defining layer 120, reduction in the area of the opposite electrode 230 may be prevented.

Figure 12C:
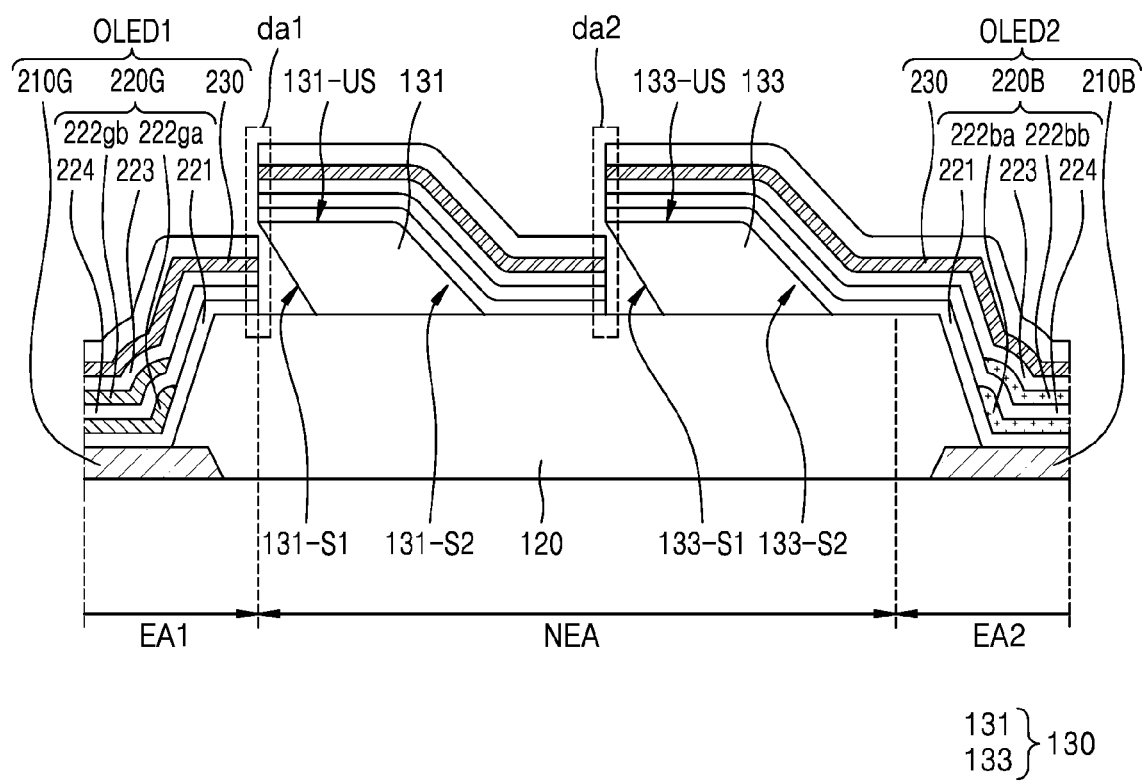

Referring to FIG. 12C, a (1-1)st lateral surface 131-S1, a (1-2)nd lateral surface 131-S2, a (2-1)st lateral surface 133-S1, and a (2-2)nd lateral surface 133-S2 may be arranged parallel in a first direction ax1. The (1-2)nd lateral surface 131-S2 may face the (2-1)st lateral surface 133-S1. The first and second common layers 221 and 223, the charge-generating layer 224, and the opposite electrode 230 may be provided as a single body on first and second organic light-emitting diodes OLED1 and OLED2. For example, portions of the first and second common layers 221 and 223, a portion of the charge-generating layer 224, and a portion of the opposite electrode 230, which are disposed on the first organic light emitting diode OLED1, may be integral with another portions of the first and second common layers 221 and 223, another portion of the charge-generating layer 224, and another portion of the opposite electrode 230, which are disposed on the second organic light emitting diode OLED2, respectively. The first and second common layers 221 and 223, the charge-generating layer 224, and the opposite electrode 230 may include a first discontinuous portion da1 and a second discontinuous portion da2. The first discontinuous portion da1 may be disconnected by the (1-1)st lateral surface 131-S1, and the second discontinuous portion da2 may be disconnected by the (2-1)st lateral surface 133-S1.

Figure 12D:
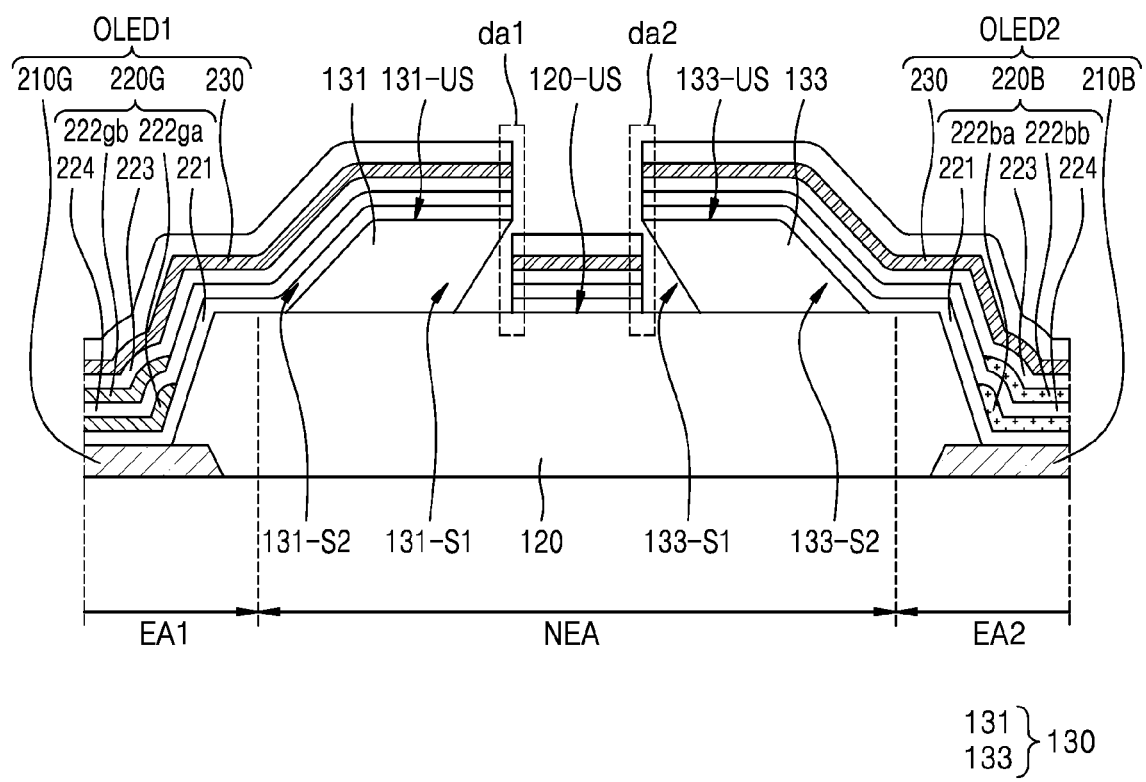

Referring to FIG. 12D, a (1-1)st lateral surface 131-S1, a (1-2)nd lateral surface 131-S2, a (2-1)st lateral surface 133-S1, and a (2-2)nd lateral surface 133-S2 may be arranged in parallel in a first direction ax1. The (1-1)st lateral surface 131-S1 may face the (2-1)st lateral surface 133-S1. The first and second common layers 221 and 223, the charge-generating layer 224, and the opposite electrode 230 may be provided as a single body on first and second organic light-emitting diodes OLED1 and OLED2. For example, portions of the first and second common layers 221 and 223, a portion of the charge-generating layer 224, and a portion of the opposite electrode 230, which are disposed on the first organic light emitting diode OLED1, may be integral with another portions of the first and second common layers 221 and 223, another portion of the charge-generating layer 224, and another portion of the opposite electrode 230, which are disposed on the second organic light emitting diode OLED2, respectively. The first and second common layers 221 and 223, the charge-generating layer 224, and the opposite electrode 230 may include a first discontinuous portion da1 and a second discontinuous portion da2. The first discontinuous portion da1 may be disconnected by the (1-1)st lateral surface 131-S1, and the second discontinuous portion da2 may be disconnected by the (2-1)st lateral surface 133-S1.

Figure 12E:
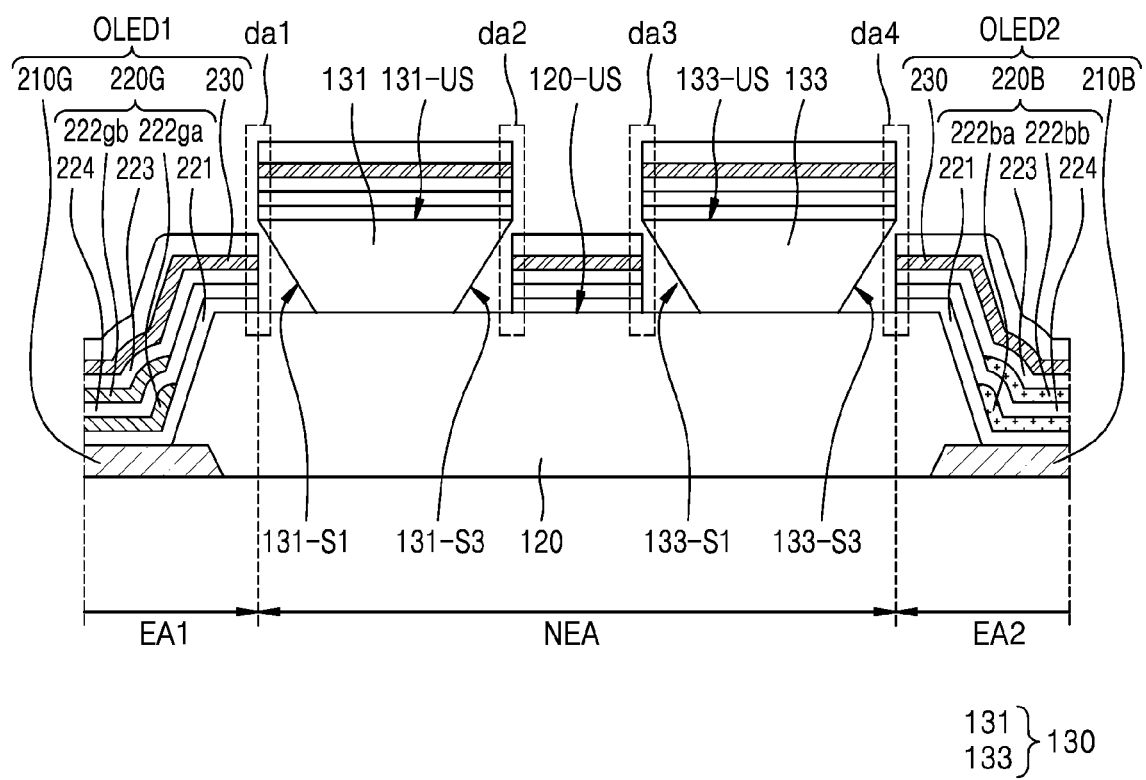

Referring to FIG. 12E, a first sub-structural layer 131 may include a (1-3)rd lateral surface 131-S3 connected (e.g., extended) to a first upper surface 131-US. The (1-3)rd lateral surface 131-S3 may have a slope tapered in a reverse direction. A second sub-structural layer 133 may include a (2-3)rd lateral surface 133-S3 connected (e.g., extended) to a second upper surface 133-US. The (2-3)rd lateral surface 133-S3 may have a slope tapered in a reverse direction. The (1-1)st lateral surface 131-S1, the (1-3)rd lateral surface 131-S3, the (2-1)st lateral surface 133-S1, and the (2-3)rd lateral surface 133-S3 may be arranged in parallel in a first direction ax1. Each of the (1-2)nd lateral surface 131-S2 and the (2-2)nd lateral surface 133-S2 may have a slope tapered in a forward direction and may be arranged in parallel in the second direction ax2.

First and second common layers 221 and 223, a charge-generating layer 224, and an opposite electrode 230 may be provided as a single body on first and second organic light-emitting diodes OLED1 and OLED2. For example, portions of the first and second common layers 221 and 223, a portion of the charge-generating layer 224, and a portion of the opposite electrode 230, which are disposed on the first organic light emitting diode OLED1, may be integral with another portions of the first and second common layers 221 and 223, another portion of the charge-generating layer 224, and another portion of the opposite electrode 230, which are disposed on the second organic light emitting diode OLED2, respectively. The first and second common layers 221 and 223, the charge-generating layer 224, and the opposite electrode 230 may include a first discontinuous portion da1, a second discontinuous portion da2, a third discontinuous portion da3, and a fourth discontinuous portion da4. The first discontinuous portion da1 to the fourth discontinuous portion da4 may be disconnected by the (1-1)st lateral surface 131-S1, the (1-3)rd lateral surface 131-S3, the (2-1)st lateral surface 133-S1, and the (2-3)rd lateral surface 133-S3, respectively. The first and second common layers 221 and 223, the charge-generating layer 224, and the opposite electrode 230 on the first upper surfaces 131-US are gently connected to the first and second common layers 221 and 223, the charge-generating layer 224, and the opposite electrode 230 on the upper surface 120-US of the pixel-defining layer 120 by the other lateral surface (e.g., 131-S2 and/or 131-S4, not shown) to be provide as a single body. The first and second common layers 221 and 223, the charge-generating layer 224, and the opposite electrode 230 on the second upper surfaces 133-US are gently connected to the first and second common layers 221 and 223, the charge-generating layer 224, and the opposite electrode 230 on the upper surface 120-US of the pixel-defining layer 120 by the other lateral surface (e.g., 133-S2 and/or 133-S4, not shown) to be provide as a single body.

As described above in the description of the structural layer 130 of FIGS. 12A to 12E, the first sub-structural layer 131 and the second sub-structural layer 133 may include one or more lateral surfaces 131-S1 and 133-S1 and one or more lateral surfaces 131-S2 and 133-S2. The one or more lateral surfaces 131-S1 and 133-S1 may be respectively connected to the first and second upper surfaces 131-US and 133-US and have a slope tapered in a reverse direction. The one or more lateral surfaces 131-S2 and 133-S2 may be respectively connected (e.g., extended) to the first and second upper surfaces 131-US and 133-US and have a slope tapered in a forward direction. Each of the lateral surfaces having a slope tapered in a forward direction may be flat surfaces or curved surfaces.

Each of the first pixel P1 and the second pixel P2 adjacent to each other may include the first and second common layers 221 and 223, the charge-generating layer 224, and the opposite electrode 230. The portions of the first and second common layers 221 and 223, the portion of the charge-generating layer 224, and the portion of the opposite electrode 230, which are included in the first pixel P1, may be provided as a single body with (e.g., integral with) the another portions of the first and second common layers 221 and 223, the another portion of the charge-generating layer 224, and the another portion of the opposite electrode 230, which are included in the second pixel P2, respectively. The first and second common layers 221 and 223, the charge-generating layer 224, and the opposite electrode 230 may include at least two discontinuous portions da1 and da2. Each of the first and second common layers 221 and 223, the charge-generating layer 224, and the opposite electrode 230 may be disconnected by the (1-1)st lateral surface 131-S1 and the (2-1)st lateral surface 133-S1. The electrical conductivity of the first and second common layers 221 and 223, the charge-generating layer 224, and the opposite electrode 230 in the at least two discontinuous portions da1 and da2 may be decreased, in which a leakage current may not occur and electrical disconnection may be formed between the first pixel P1 and the second pixel P2.

The first and second common layers 221 and 223, the charge-generating layer 224, and the opposite electrode 230, which are disposed on the first and second upper surfaces 131-US and 133-US may be gently connected and integral with the first and second common layers 221 and 223, the charge-generating layer 224, and the opposite electrode 230, which are disposed on the upper surface 120-US of the pixel-defining layer 120 by the (1-2)nd lateral surface 131-S2 and the (2-2)nd lateral surface 133-S2. For example, the portions of the first and second common layers 221 and 223, the portion of the charge-generating layer 224, and the portion of the opposite electrode 230, which are disposed on the first and second upper surfaces 131-US and 133-US, may be gently connected to and provided as a single body with (e.g., integral with) the another portions of the first and second common layers 221 and 223, the another portion of the charge-generating layer 224, and the another portion of the opposite electrode 230, which are disposed on the upper surface 120-US of the pixel-defining layer 120, respectively. Accordingly, the portions of the opposite electrode 230 disposed on the first and second upper surfaces 131-US and 133-US of the first and second sub-structural layers may not be completely disconnected from the another portion of the opposite electrode 230 on the upper surface 120-US of the pixel-defining layer 120, and the area of the opposite electrode 230 may not be reduced. For example, the size of the opposite electrode 230 may be maximized by the (1-2)nd lateral surface 131-S2 and the (2-2)nd lateral surface 133-S2.

Figure 13:
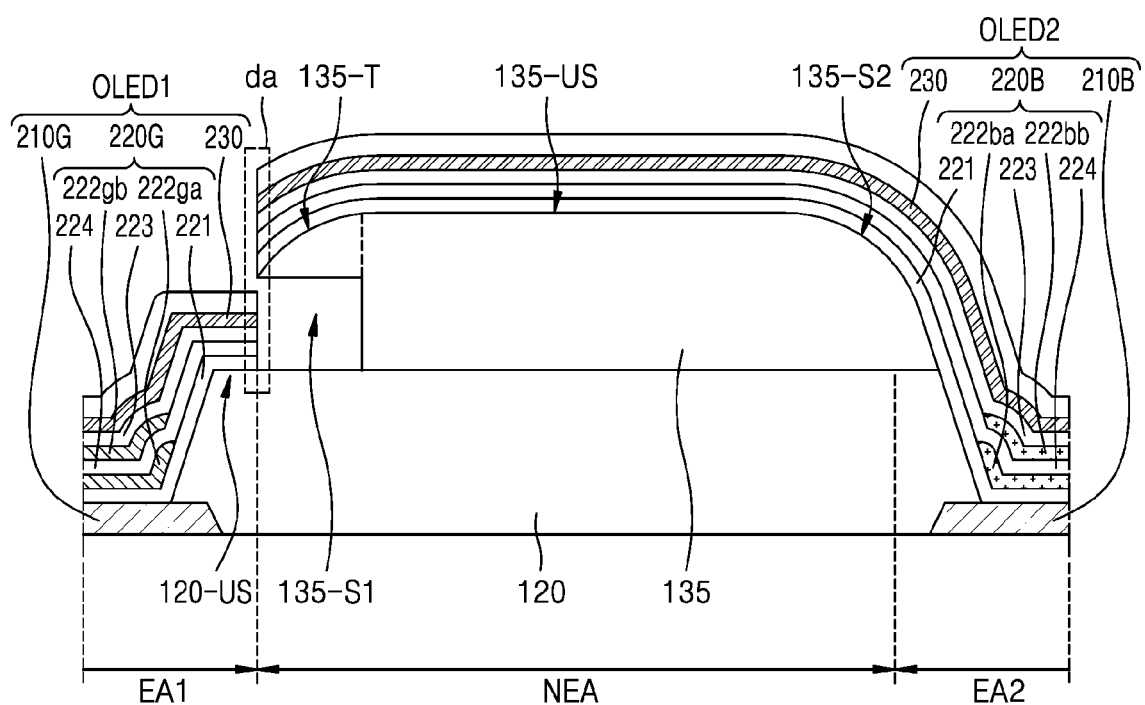
FIGS. 13 and 14 are schematic enlarged views of a portion of the display apparatus shown in FIG. 11.
Figure 14:
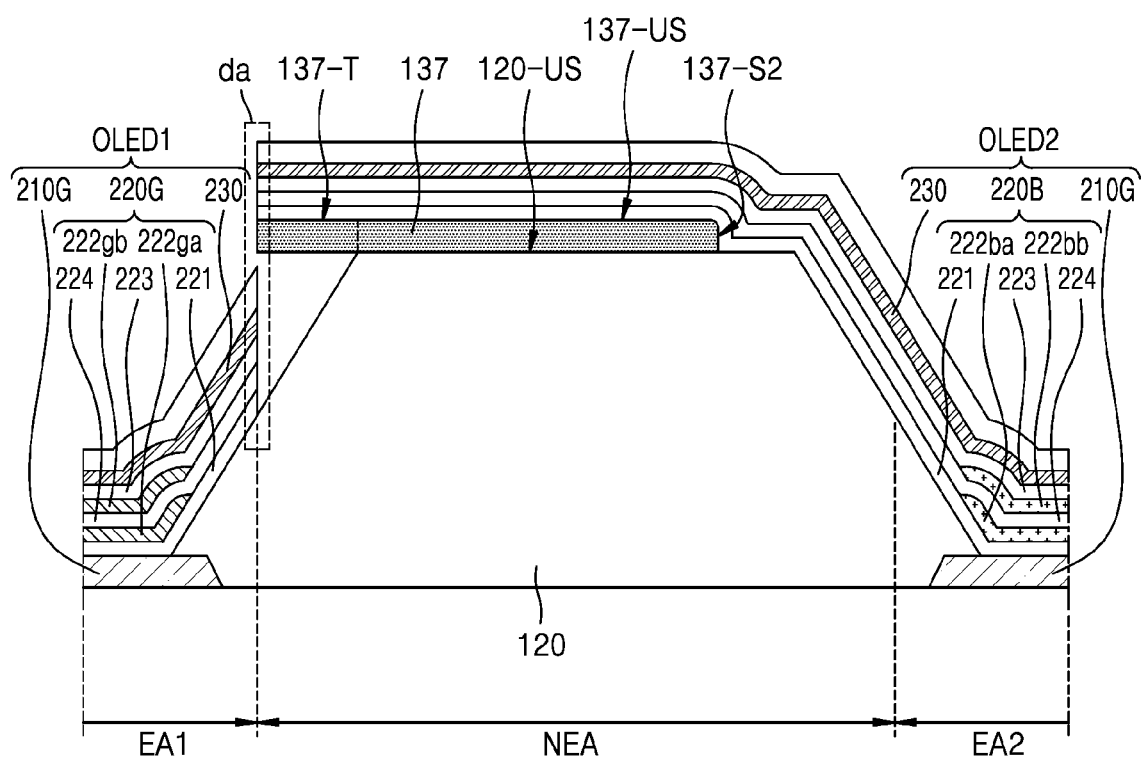

FIGS. 13 and 14 are schematic enlarged views of a portion of the display apparatus shown in FIG. 11.

FIGS. 13 and 14 are similar to FIG. 9B but different from FIG. 9B at least in that structural layers 135 and 137 have a tip structure protruding toward the emission area EA. Hereinafter, repeated descriptions are omitted and differences of the structural layers 135 and 137 are mainly described.

Referring to FIG. 13, the structural layer 135 may be arranged on a pixel-defining layer 120. The structural layer 135 may have a tip structure 135-T and a second lateral surface 135-S2. The tip structure 135-T may protrude toward the first emission area EA1. A second lateral surface 135-S2 may be connected (e.g., extended) to an upper surface 135-US of the structural layer 135 and have a slope tapered in a forward direction. The tip structure 135-T may cover a portion of an upper surface 120-US of the pixel-defining layer 120. For example, the first and second common layers 221 and 223, the charge-generating layer 224, and the opposite electrode 230 may be provided as a single body on first and second organic light-emitting diodes OLED1 and OLED2. For example, portions of the first and second common layers 221 and 223, a portion of the charge-generating layer 224, and a portion of the opposite electrode 230, which are disposed on the first organic light emitting diode OLED1, may be integral with another portions of the first and second common layers 221 and 223, another portion of the charge-generating layer 224, and another portion of the opposite electrode 230, which are disposed on the second organic light emitting diode OLED2, respectively. The first and second common layers 221 and 223, the charge-generating layer 224, and the opposite electrode 230 may have a discontinuous portion da disconnected by the tip structure 135-T. The first and second common layers 221 and 223, the charge-generating layer 224, and the opposite electrode 230, which are disposed on the upper surface 135-US of the structural layer 135, may be gently connected (e.g., extended) to and provided as a single body (e.g., integral with) the first and second common layers 221 and 223, the charge-generating layer 224, and the opposite electrode 230 on the upper surface 120-US of the pixel-defining layer 120 by the second lateral surface 135-S2. For example, the portions of the first and second common layers 221 and 223, the portion of the charge-generating layer 224, and the portion of the opposite electrode 230, which are disposed on the upper surface 135-US of the structural layer 135, may be gently connected to and provided as a single body with (e.g., integral with) the another portions of the first and second common layers 221 and 223, the another portion of the charge-generating layer 224, and the another portion of the opposite electrode 230, which are disposed on the upper surface 120-US of the pixel-defining layer 120, respectively.

In an embodiment, the structural layer 135 may include an organic material. As an example, the structural layer 135 and the pixel-defining layer 120 may include a same material. In an embodiment, the structural layer 135 and the pixel-defining layer 120 may be integral with each other.

Referring to FIG. 14, the structural layer 137 may be an inorganic layer protruding toward a first emission area EA1. The structural layer 137 may have a tip structure 137-T protruding toward the first emission area EA1 from an upper surface 120-US of a pixel-defining layer 120. In an embodiment, a second lateral surface 137-S2 of the structural layer 137 may be spaced apart toward a center of the pixel-defining layer 120 from a boundary of the upper surface 120-US of the pixel-defining layer 120. In another embodiment, the second lateral surface 137-S2 of the structural layer 137 may be arranged on the boundary of the upper surface 120-US of the pixel-defining layer 120. In an embodiment, though not shown the drawings, the second lateral surface 137-S2 of the structural layer 137 may have a slope tapered in a forward direction, and connect the upper surface 120-US of the pixel-defining layer 120 to the upper surface 137-US of the structural layer 137.

The tip structure 137-T may cover a portion of the upper surface 120-US of the pixel-defining layer 120. Accordingly, the first and second common layers 221 and 223, the charge-generating layer 224, and the opposite electrode 230 are provided as a single body on the first and second organic light-emitting diodes OLED1 and OLED2. For example, portions of the first and second common layers 221 and 223, a portion of the charge-generating layer 224, and a portion of the opposite electrode 230, which are disposed on the first organic light emitting diode OLED1, may be provided as a single body with (e.g., integral with) another portions of the first and second common layers 221 and 223, another portion of the charge-generating layer 224, and another portion of the opposite electrode 230, which are disposed on the second organic light emitting diode OLED2, respectively. The first and second common layers 221 and 223, the charge-generating layer 224, and the opposite electrode 230 may have a discontinuous portion da. The discontinuous portion da may be disconnected by the tip structure 137-T. The first and second common layers 221 and 223, the charge-generating layer 224, and the opposite electrode 230 on the upper surface 137-US of the structural layer 137, may be gently connected (e.g., extended) to the first and second common layers 221 and 223, the charge-generating layer 224, and the opposite electrode 230 on the upper surface 120-US of the pixel-defining layer 120, by the second lateral surface 137-S2. For example, portions of the first and second common layers 221 and 223, a portion of the charge-generating layer 224, and a portion of the opposite electrode 230, which are disposed on the upper surface 137-US, may be gently connected to and provided as a single body with (e.g., integral with) another portions of the first and second common layers 221 and 223, another portion of the charge-generating layer 224, and another portion of the opposite electrode 230, which are disposed on the upper surface 120-US of the pixel-defining layer 120, respectively.

As described above with reference to FIGS. 7A to 7D, the structural layers 135 and 137 may include the tip structures 135-T and 137-T and a third lateral surface and a fourth lateral surface, and each of the third and fourth lateral surfaces may have a slope tapered in a forward direction. However, the first to fourth lateral surfaces may be variously arranged.

FIGS. 15A to 15D are schematic plan views of a portion of the display apparatus according to an embodiment.

Figure 15A:
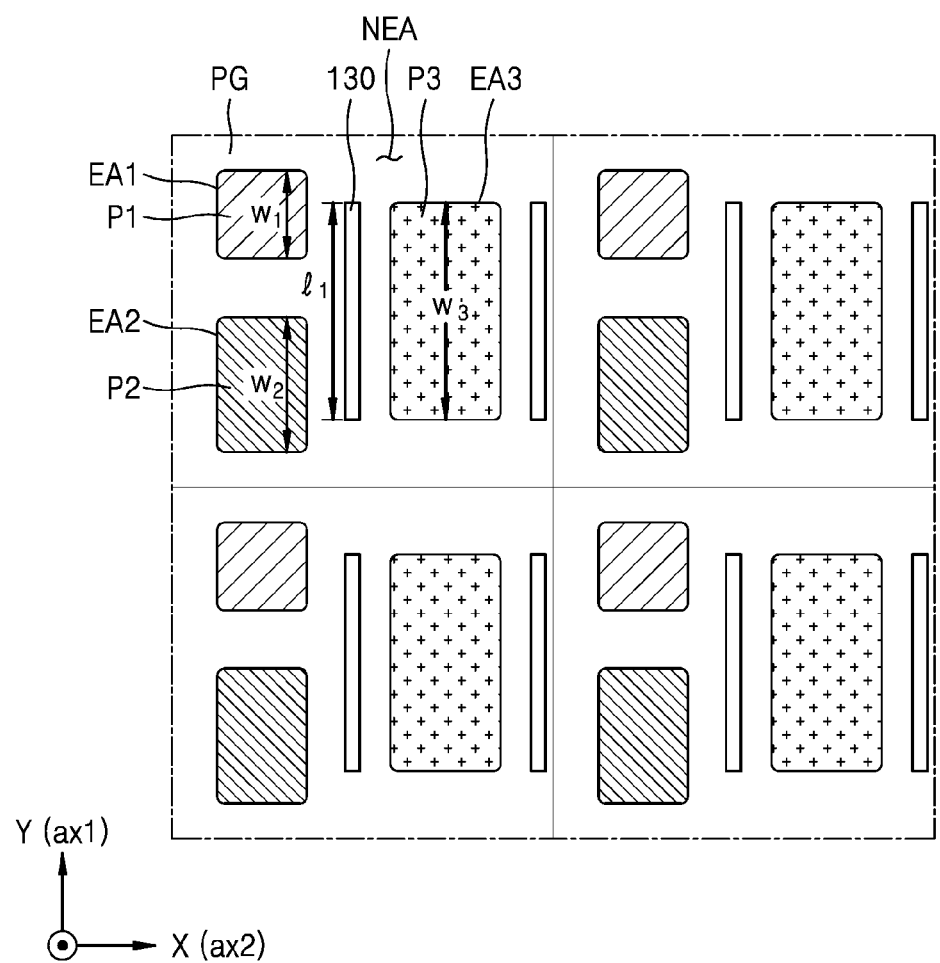
FIGS. 15A to 15D are schematic plan views of a portion of the display apparatus according to an embodiment.

Referring to FIG. 15A, pixels P (e.g., refer to FIG. 1) may be arranged in a display area DA (e.g., refer to FIG. 1). The pixels P (e.g., refer to FIG. 1) may each include a display element such as an organic light-emitting diode OLED (e.g., refer to FIG. 3). In the specification, the pixel P (e.g., refer to FIG. 1) may be a sub-pixel emitting red, green, blue, or white light.

In an embodiment, the pixels P (e.g., refer to FIG. 1) arranged in the display area DA (e.g., refer to FIG. 1) may include a first pixel P1, a second pixel P2, and a third pixel P3. The first pixel P1 may emit red light. The second pixel P2 may emit green light. The third pixel P3 may emit blue light. In an embodiment, virtual cells may be defined and arranged in a lattice shape, and three pixels P may be arranged inside each of the cells (e.g., virtual cells). As an example, the first pixel P1 emitting the red light, the second pixel P2 emitting the green light, and the third pixel P3 emitting the blue light may be arranged in each of the cells (e.g., virtual cells) of FIG. 15A.

The first to third pixels P1, P2, and P3 may respectively include an organic light-emitting diode OLED (e.g., FIGS. 4 and 5). Each of the organic light-emitting diodes may include pixel electrodes 210G, 210B (e.g., refer to FIG. 9A), and 210R (not shown), an opposite electrode 230 (e.g., refer to FIGS. 9A), and intermediate layers 220R, 220G, and 220B. The intermediate layers 220R, 220G, and 220B may be disposed between the pixel electrodes 210G, 210B (e.g., refer to FIG. 9A), and 210R (not shown) and the opposite electrode 230. In an embodiment, the intermediate layers 220R, 220G, and 220B may include emission layers 222r, 222g, and 222b (not shown), and first and second common layers 221 and 223 (e.g., refer to FIG. 9A). The emission layers 222r, 222g, and 222b may be respectively arranged on the pixel electrodes 210R, 210G, and 210B. The first and second common layers 221 and 223 may be arranged as a single body on and/or under the emission layers 222r, 222g, and 222b which are disposed on the first to third pixels P1, P2, and P3. In another embodiment, the intermediate layers 220R, 220G, and 220B may include lower emission layers 222ga, 222ba (e.g., refer to FIG. 9A), and 222ra (not shown), upper emission layers 222gb, 222bb (e.g., refer to FIG. 9A), and 222rb (not shown), the first and second common layers 221 and 223, and a charge-generating layer 224 (e.g., refer to FIG. 9A). The lower emission layers 222ra, 222ga, and 222ba, and the upper emission layers 222rb, 222gb and 222bb may be respectively arranged on the pixel electrodes 210R, 210G, and 210B. The first and second common layers 221 and 223 may be arranged as a single body on the first to third pixels P1, P2, and P3.

A pixel-defining layer 120 (e.g., refer to FIG. 9A) may include an opening OP (e.g., refer to FIG. 9A) exposing a central portion of each of the pixel electrodes 210R, 210G (e.g., refer to FIG. 9A), and 210B (e.g., refer to FIG. 9A). The emission areas EA (e.g., EA1, EA2, and EA3 of FIG. 15A) of the first to third pixels P1, P2, and P3 may be defined by the opening OP. A non-emission area NEA may be provided between the first to third pixels P1, P2, and P3. The non-emission area NEA may be a region between the first, second and third emission areas EA1, EA2, and EA3.

Multiple first pixels P1 and multiple second pixels P2 may be alternately arranged in a first direction ax1 (e.g., y-direction). The third pixel P3 may be spaced apart by an interval from the first pixel P1 and the second pixel P2 in a second direction ax2 (e.g., x-direction). The first pixel P1, the second pixel P2, and the third pixel P3 may respectively emit light in different wavelengths. In an embodiment, a driving voltage of the third pixel P3 may be greater than driving voltages of the first pixel P1 and the second pixel P2.

In an embodiment, areas of the first pixel P1, the second pixel P2, and the third pixel P3 may be different from one another. As an example, a width $w_3$ of the third pixel P3 in the first direction ax1 (e.g., y-direction) may be greater than a width $w_1$ of the first pixel P1 and a width $w_2$ of the second pixel P2 in the first direction ax1 (e.g., y-direction).

In an embodiment, a first structural layer 130 may be arranged in the first direction ax1 (e.g., y-direction) between the first pixel P1 and the third pixel P3. A length $l_1$ of the first structural layer 130 in the first direction ax1 (e.g., y-direction) may be equal to or greater than the width $w_3$ of the third pixel P3 in the first direction ax1 (e.g., y-direction). The first structural layer 130, the first and second common layers 221 and 223 (e.g., refer to FIG. 9A), the charge-generating layer 224 (e.g., refer to FIG. 9A), and the opposite electrode 230 (e.g., refer to FIG. 9A) may have a discontinuous portion in the first direction ax1 (e.g., y-direction) between the first pixel P1 and the third pixel P3 and between the second pixel P2 and the third pixel P3. For example, the discontinuous portion da (e.g., refer to FIG. 9B) may be formed through the first structural layer 130 (e.g., refer to FIG. 9A), the first and second common layers 221 and 223 (e.g., refer to FIG. 9A), the charge-generating layer 224 (e.g., refer to FIG. 9A), and the opposite electrode 230 (e.g., refer to FIG. 9A). The discontinuous portion da (e.g., refer to FIG. 9A) may be disposed between the first pixel P1 and the third pixel P3 and between the second pixel P2 and the third pixel P3, and arranged in the first direction ax1 (e.g., y-direction). Accordingly, a leakage current between the first pixel P1 and the third pixel P3 and between the second pixel P2 and the third pixel P3 may be reduced.

Figure 15B:
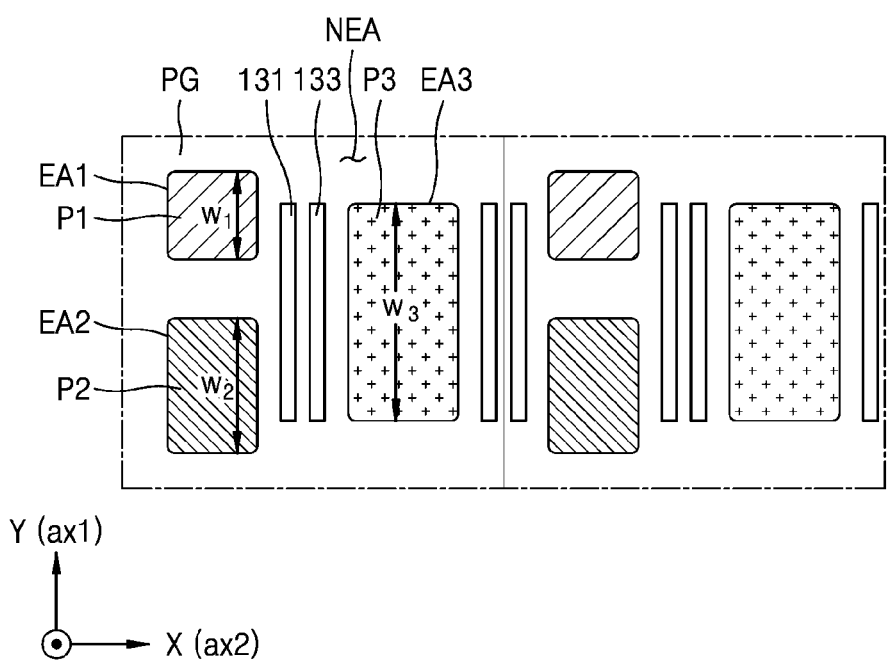

In an embodiment, referring to FIG. 15B, a first structural layer 130 (e.g., refer to FIG. 15A) may include a first sub-structural layer 131 and a second sub-structural layer 133. The first and second sub-structural layers 131 and 133 may be parallel to and spaced apart from each other. The first sub-structural layer 131 and the second sub-structural layer 133, first and second common layers 221 and 223 (e.g., refer to FIG. 12A), a charge-generating layer 224 (e.g., refer to FIG. 12A), and an opposite electrode 230 (e.g., refer to FIG. 12A) may have at least two discontinuous portions in a first direction ax1 (e.g., y-direction) between a first pixel P1 and a third pixel P3 and between a second pixel P2 and the third pixel P3. For example, at least two discontinuous portions da1 and da2 (e.g., refer to FIG. 12A) may be formed through the first and second sub-structural layers 131 and 133, the first and second common layers 221 and 223 (e.g., refer to FIG. 12A), the charge-generating layer 224 (e.g., refer to FIG. 12A), and the opposite electrode 230 (e.g., refer to FIG. 12A). The at least two discontinuous portions da1 and da2 (e.g., refer to FIG. 12A) may be disposed between the first pixel P1 and the third pixel P3 and between the second pixel P2 and the third pixel P3, and arranged in the first direction ax1 (e.g., y-direction).

Figure 15C:
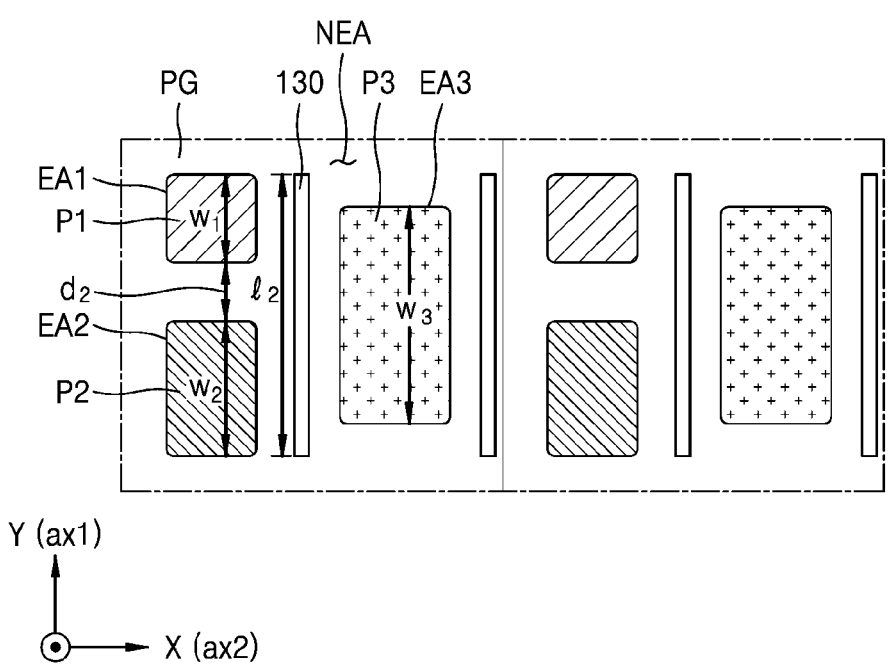

Referring to FIG. 15C, a length $l2$ of a first structural layer 130 in a first direction ax1 (e.g., y-direction) may be equal to or greater than a sum of a width $w_1$ of a first pixel P1 in a first direction ax1 (e.g., y-direction), a width $w_2$ of a second pixel P2 in a first direction ax1 (e.g., y-direction), and a width $d_2$ of a region between the first pixel P1 and the second pixel P2.

Figure 15D:
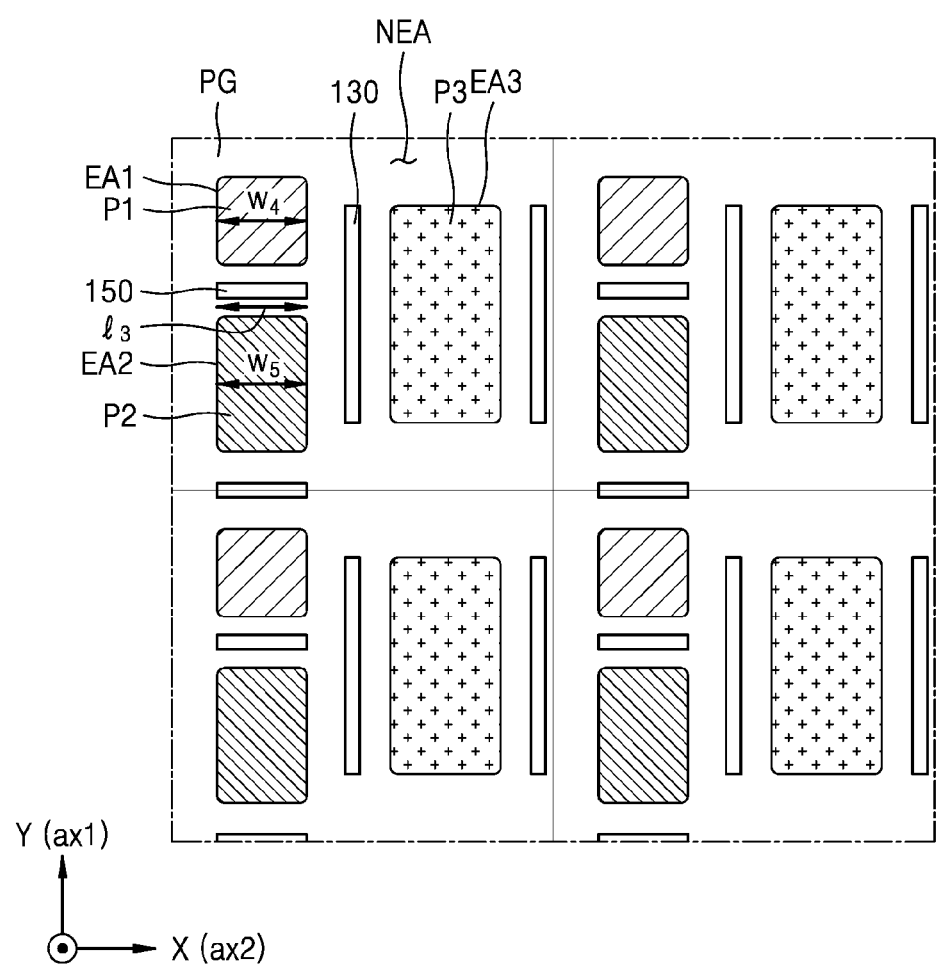

Referring to FIG. 15D, a second structural layer 150 may be arranged in a second direction ax2 (e.g., x-direction) between a first pixel P1 and a second pixel P2. A length $l_3$ of the second structural layer 150 in the second direction ax2 (e.g., x-direction) may be equal to a greater width among a width $w_4$ of the first pixel P1 in the second direction ax2 (e.g. x-direction) and a width $w_5$ of the second pixel P2 in the second direction ax2 (e.g. x-direction). The second structural layer 150 may include a first sub-structural layer and a second sub-structural layer parallel to and spaced apart from each other in the second direction ax2 (e.g., x-direction). The first structural layer 130 may include a first sub-structural layer and a second sub-structural layer parallel to and spaced apart from each other in the first direction ax1 (e.g., y-direction).

The second structural layer 150, common layers (e.g., first and second common layers 221 and 223 of FIG. 9A), charge-generating layer 224 (e.g., refer to FIG. 9A), and opposite electrode 230 (e.g., refer to FIG. 9A) may have a discontinuous portion between the first pixel P1 and the second pixel P2 in the second direction ax2 (e.g., x-direction). For example, the discontinuous portion da (e.g., refer to FIG. 9B) may be formed through the second structural layer 150, the common layers (e.g., first and second common layers 221 and 223 of FIG. 9A), the charge-generating layer 224 (e.g., refer to FIG. 9A), and the opposite electrode 230 (e.g., refer to FIG. 9A) between the first pixel P1 and the second pixel P2, and arranged in the second direction ax2 (e.g., x-direction). Accordingly, a leakage current between the first pixel P1 and the second pixel P2 may be reduced.

FIGS. 16A to 16D are schematic plan views of a portion of the display apparatus according to an embodiment.

FIGS. 16A to 16D are similar to FIG. 15A and different from FIG. 15A at least in the arrangement of the third pixel P3. Hereinafter, repetitive descriptions are omitted and differences in the arrangement of the third pixel P3 and a corresponding difference of the first structural layer 130 are mainly described.

Figure 16A:
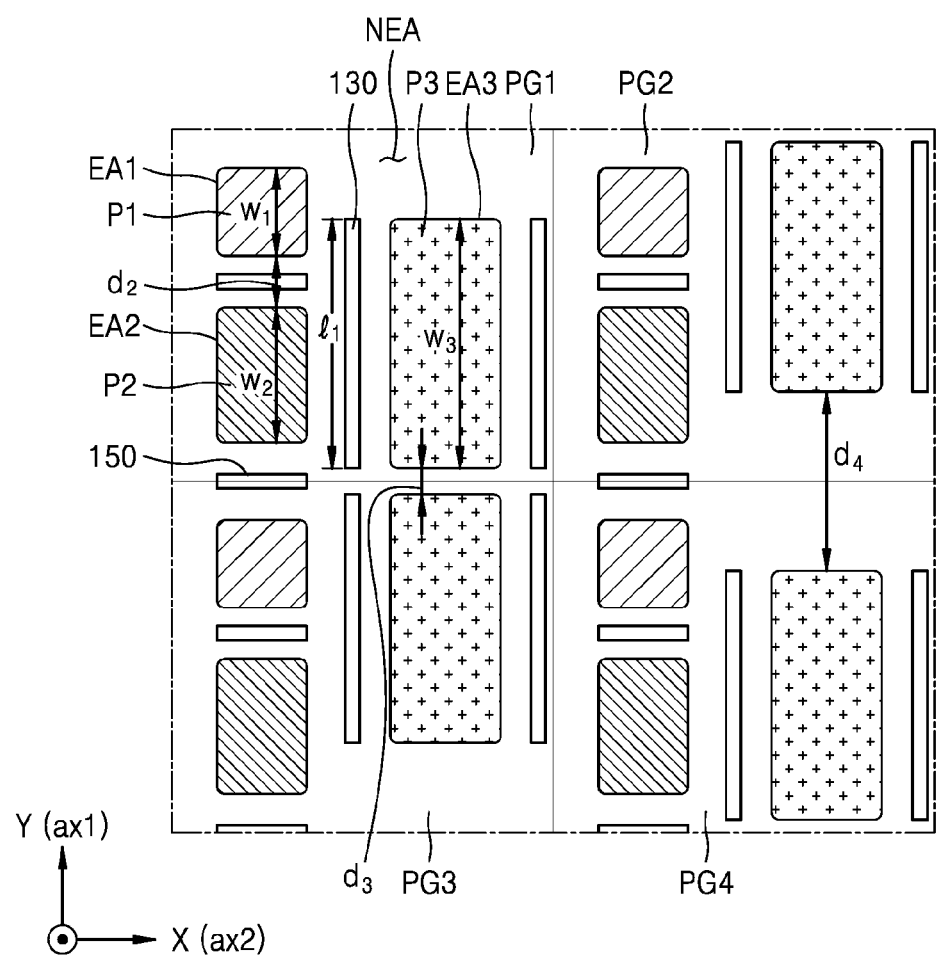
FIGS. 16A to 16D are schematic plan views of a portion of the display apparatus according to an embodiment.
Figure 16B:
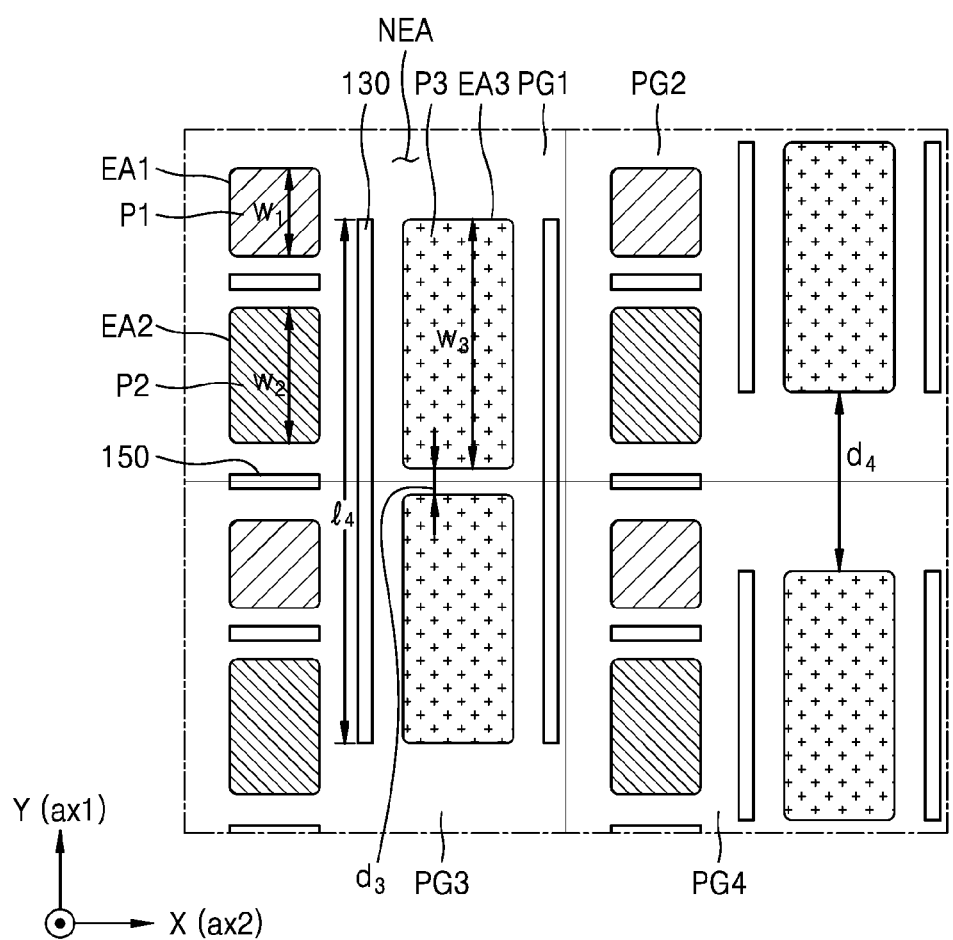

Referring to FIGS. 16A and 16B, the third pixels P3 included in two cells PG1 and PG3 adjacent to each other in a first direction ax1 (e.g., y-direction) may share the same pixel electrode 210B (e.g., refer to FIG. 9A). For example, the same pixel electrode 210B (e.g., refer to FIG. 9A) may extend over (or be disposed in) the third pixels P3 included in the two cells PG1 and PG3 adjacent to each other in the first direction ax1 (e.g., y-direction). A width $d_3$ of a region between the third pixels P3 sharing the same pixel electrode 210B (e.g., refer to FIG. 9A) may be smaller than a width da of a region between third pixels P3 arranged on different pixel electrodes 210B (e.g., refer to FIG. 9A).

In an embodiment, a length $l_1$ of a first structural layer 130 of FIG. 16A in the first direction ax1 (e.g., y-direction) may be equal to the width $w_3$ of the third pixel P3 in the first direction ax1 (e.g. y-direction). Accordingly, as shown in FIG. 16A, the first structural layer 130 may correspond to two opposite sides of a third emission area EA3 of the third pixel P3.

In another embodiment, a length $l_4$ of the first structural layer 130 of FIG. 16B in the first direction ax1 (e.g., y-direction) may be equal to a sum of the width $w_3$ of the third pixels P3 sharing the same pixel electrode 210B (e.g., refer to FIG. 9A) in the first direction ax1 (e.g., y-direction) and the width $d_3$ of a region disposed therebetween.

In case that a driving voltage of the first pixel P1 is different from a driving voltage of the second pixel P2, a second structural layer 150 may be arranged in a second direction ax2 (e.g., x-direction) between the first pixel P1 and the second pixel P2. In another embodiment, in case that the driving voltage of the first pixel P1 is equal or similar to the driving voltage of the second pixel P2, the second structural layer 150 may not be arranged (e.g., may be unnecessary).

In an embodiment, each of the first structural layer 130 and the second structural layer 150 may include a first sub-structural layer and a second sub-structural layer parallel to and spaced apart from each other.

Figure 16C:
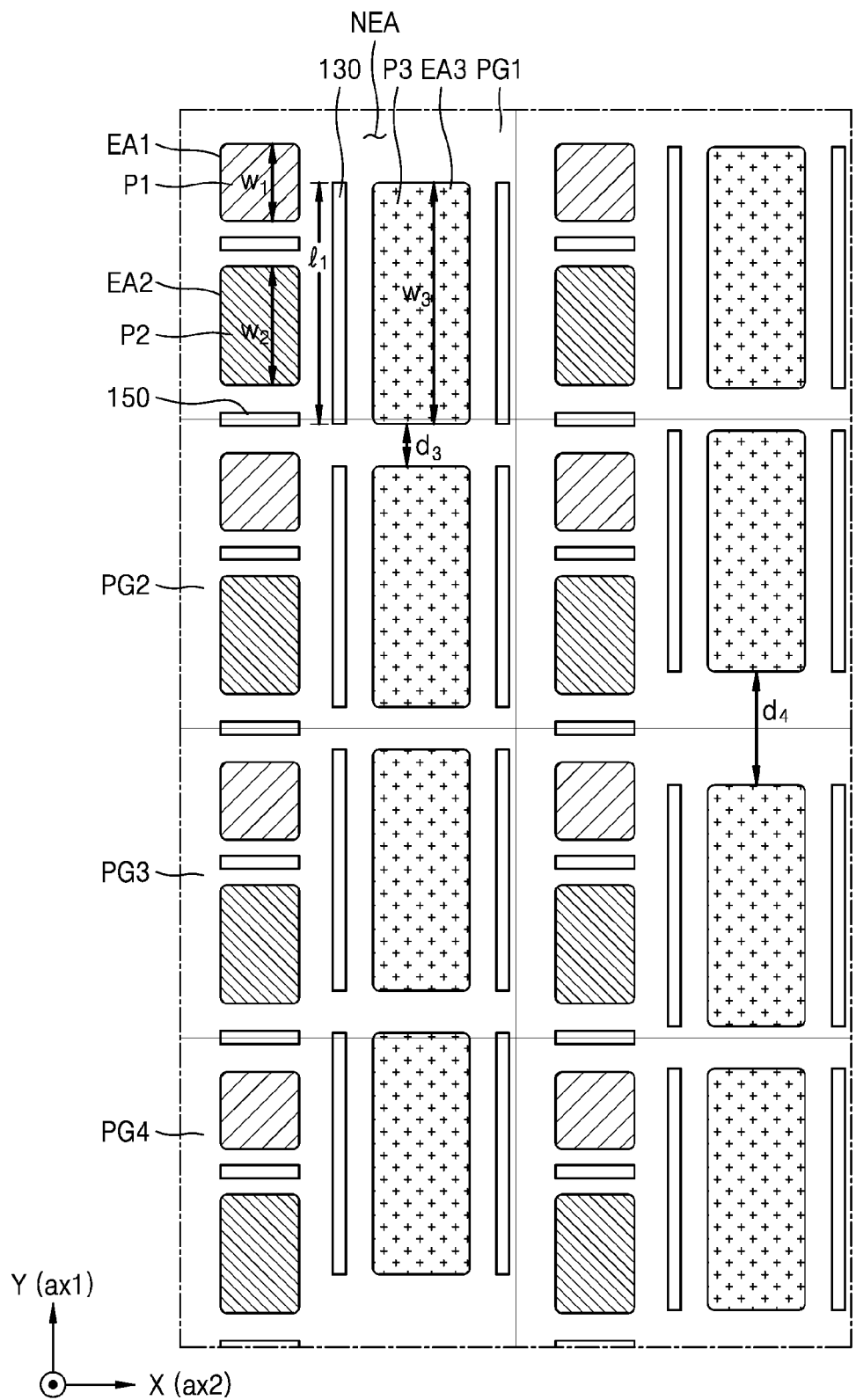
Figure 16D:
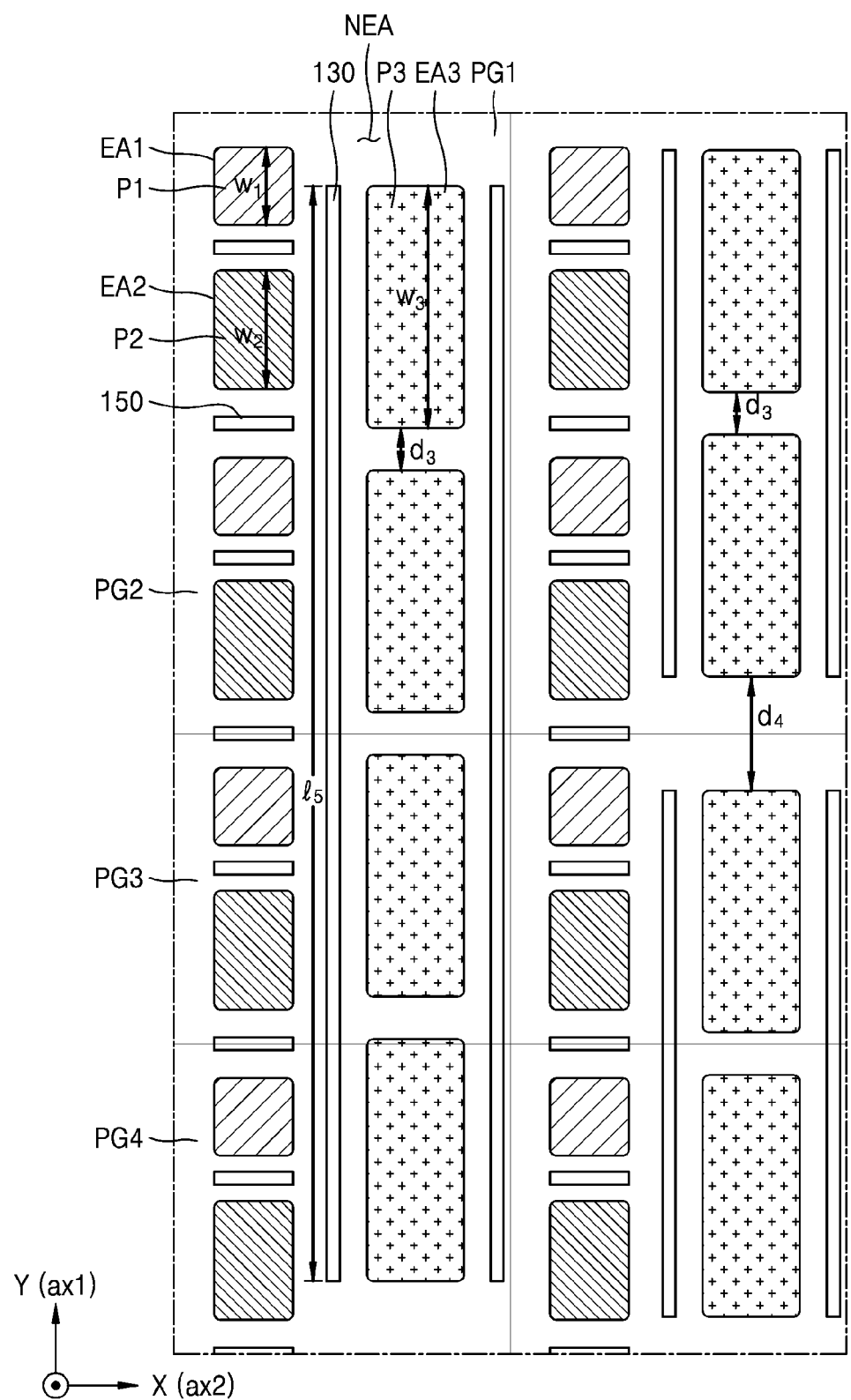

Referring to FIGS. 16C and 16D, third pixels P3 included in four cells PG1, PG2, PG3, and PG4 adjacent to each other in a first direction ax1 (e.g., y-direction) may share the same pixel electrode 210B (e.g., refer to FIG. 9A). For example, the same pixel electrode 210B (e.g., refer to FIG. 9A) may extend over (or be disposed in) the third pixels P3 included in the four cells PG1, PG2, PG3, and PG4 adjacent to each other in the first direction ax1 (e.g., y-direction). A width $d_3$ of a region between the third pixels P3 sharing the same pixel electrode 210B (e.g., refer to FIG. 9A) may be smaller than a width $d_4$ of a region between third pixels P3 arranged on different pixel electrodes 210B (e.g., refer to FIG. 9A).

As described above with reference to FIG. 16A, the length $l_1$ of the first structural layer 130 in the first direction ax1 (e.g., y-direction) may be equal to the width $w_3$ of the third pixel P3 in the first direction ax1 (e.g., y-direction). Accordingly, as shown in FIG. 16C, the first structural layer 130 may correspond to a side of the third emission area EA3 of the third pixel P3.

In another embodiment, the length $l_4$ of the first structural layer 130 of FIG. 16B in the first direction ax1 (e.g., y-direction) may be equal to the sum of the width $w_3$ of the third pixels P3 sharing the same pixel electrode 210B (e.g., refer to FIG. 9A) in the first direction ax1 (e.g., y-direction) and the width $d_3$ of the region disposed therebetween. For example, the length $l_5$ of the first structural layer 130 of FIG. 16D in the first direction ax1 (e.g. y-direction) may be equal to a sum of the width $w_3$ of the four third pixels P3 sharing the same pixel electrode 210B (e.g., refer to FIG. 9A) in the first direction ax1 (e.g., y-direction) and the width $d_3$ of three regions disposed therebetween.

FIGS. 17A to 17D are schematic plan views of a portion of the display apparatus according to an embodiment.

Figure 17A:
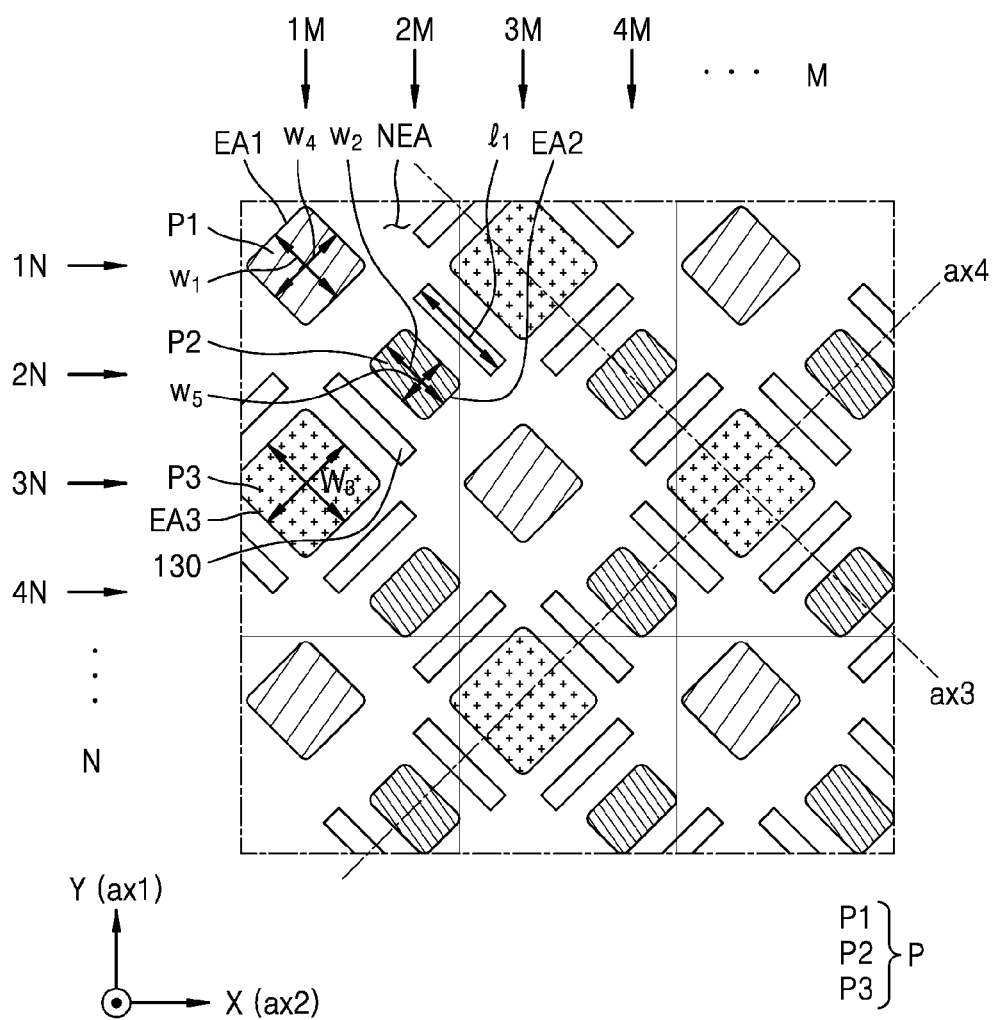
FIGS. 17A to 17D are schematic plan views of a portion of the display apparatus according to an embodiment.
Figure 17B:
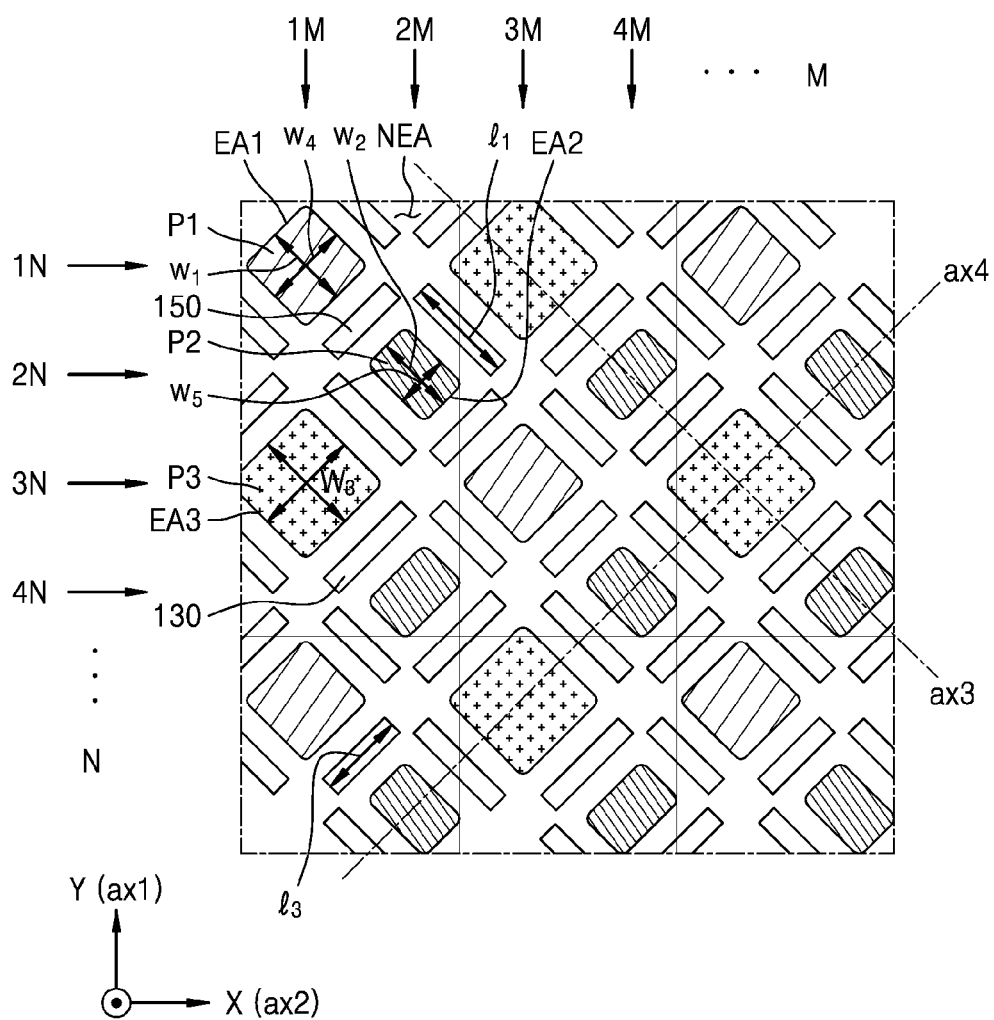

Referring to FIGS. 17A and 17B, virtual cells may be defined and arranged in a lattice shape, and two pixels P may be arranged inside each of the cells (e.g., virtual cells). As an example, a combination of a first pixel P1 emitting red light and a second pixel P2 emitting green light, or a combination of a second pixel P2 emitting green light and a third pixel P3 emitting blue light may be arranged in each of the cells (e.g., virtual cells).

First pixels P1 and third pixels P3 may be alternately arranged in a first row 1N, and second pixels P2 may be spaced apart from each other with an interval in a second row 2N adjacent to the first row 1N. Third pixels P3 and first pixels P1 may be alternately arranged in a third row 3N, and second pixels P2 may be spaced apart from each other with an interval in a fourth row 4N adjacent to the third row 3N. The arrangement of the pixels P1, P2, and P3 may be repeated to an N-th row.

The first pixels P1 and the third pixels P3 in the first row 1N and the second pixels P2 in the second row 2N may be alternately arranged with each other. Accordingly, the first pixels P1 and the third pixels P3 may be alternately arranged in a first column 1M, and the second pixels P2 may be arranged with an interval in a second column 2M adjacent to the first column 1M. The third pixels P3 and the first pixels P1 may be alternately arranged in a third column 3M adjacent to the second column 2M, and the second pixels P2 may be arranged with an interval in a fourth column 4M adjacent to the third column 3M. The arrangement of the pixels P1, P2, and P3 may be repeated to an M-th column.

The first structural layer 130 may be arranged between the second pixel P2 and the third pixel P3. The first structural layer 130 may correspond to each side of a third emission area EA3, and surround the third emission area EA3 of one of the third pixels P3. A length $l_1$ of the first structural layer 130 in a third direction ax3 may be equal to or greater than the width $w_3$ of the third emission area EA3 in a third direction ax3.

In an embodiment, in case that a driving voltage of the first pixel P1 is different from a driving voltage of the second pixel P2, a second structural layer 150 may be arranged in a fourth direction ax4 between the first pixel P1 and the second pixel P2 as shown in FIG. 17B. A length $l_3$ of the second structural layer 150 in the fourth direction ax4 may be equal to or greater than a greater width among a width $w_4$ of the first pixel P1 in the fourth direction ax4 and a width $w_5$ of the second pixel P2 in the fourth direction ax4.

Figure 17C:
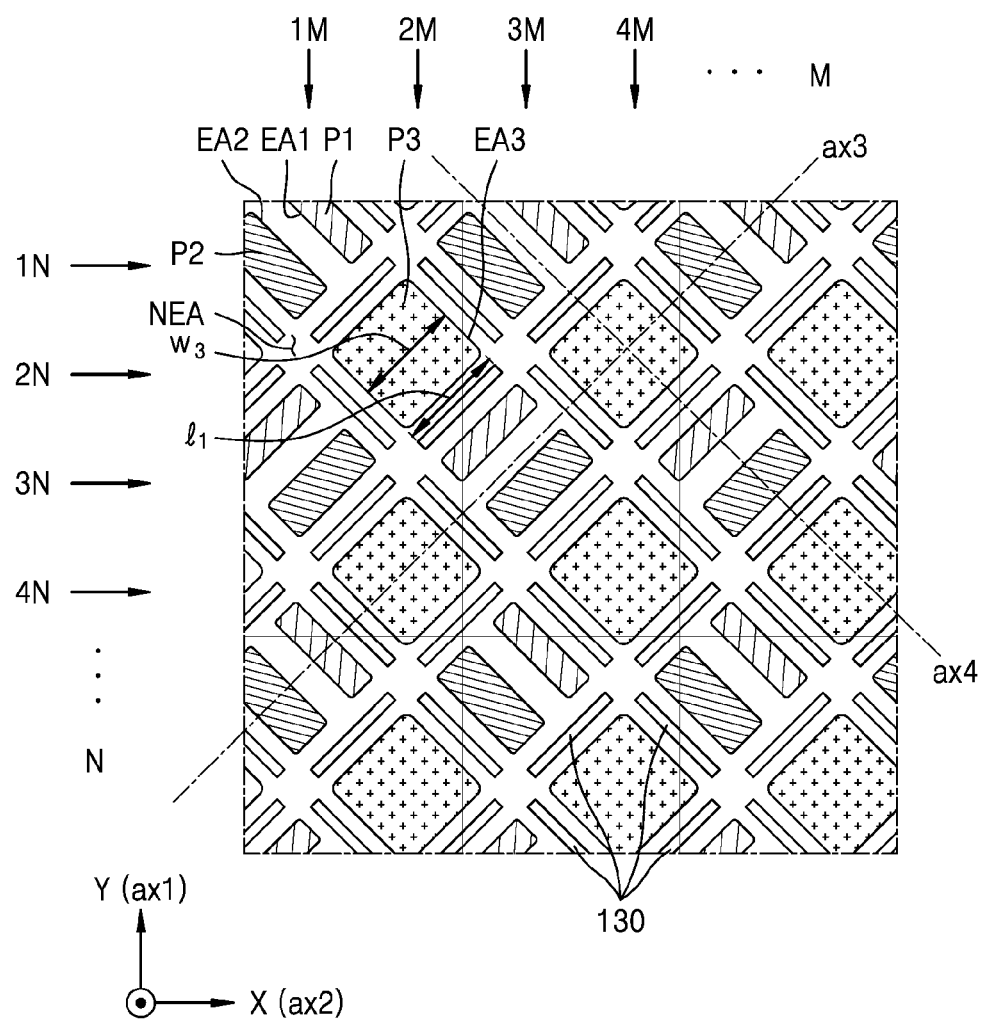
Figure 17D:
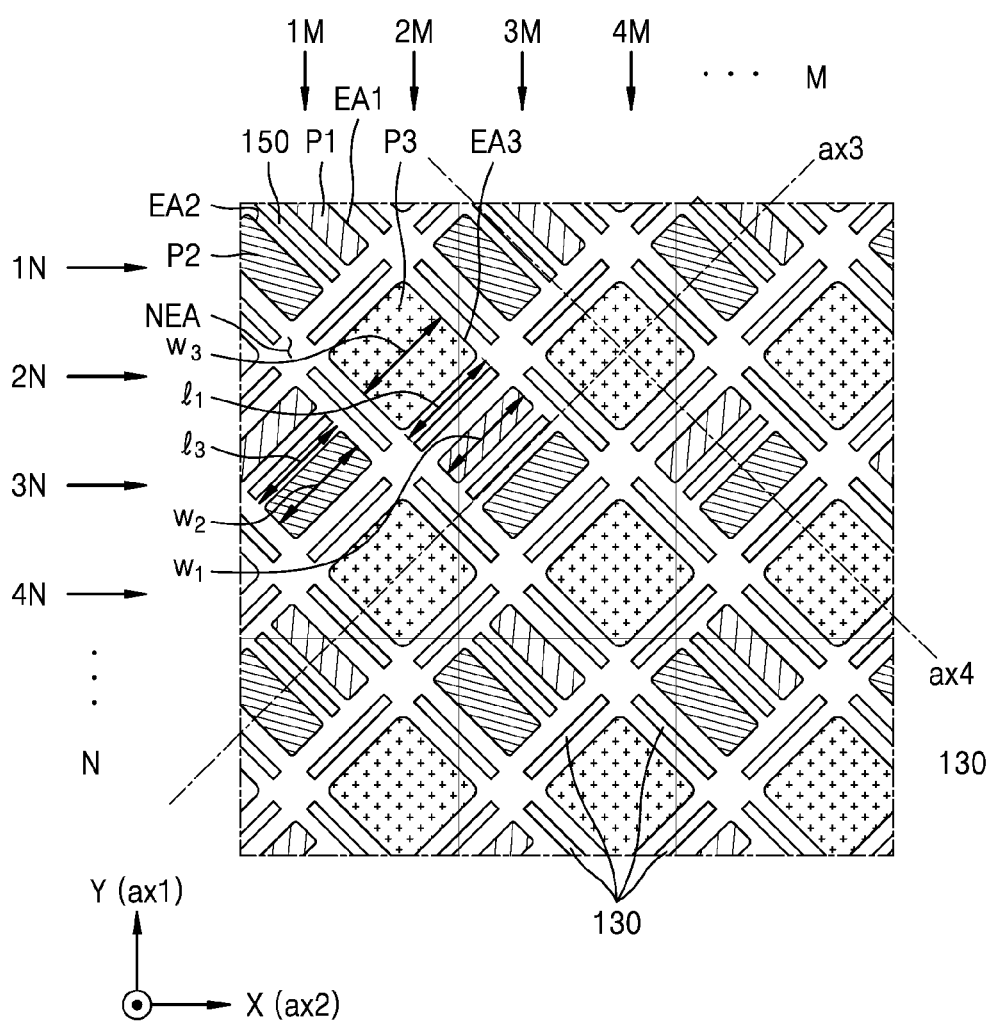

Referring to FIGS. 17C and 17D, virtual cells may be defined and arranged in a lattice shape, and three pixels P may be arranged inside each of the cells (e.g., virtual cells). As an example, a first pixel P1 emitting red light, a second pixel P2 emitting green light, and a third pixel P3 emitting blue light may be arranged in each of the cells (e.g., virtual cells).

First pixels P1 and second pixels P2 may be alternately arranged in a first row 1N, and third pixels P3 may be spaced apart from each other with an interval in a second row 2N adjacent to the first row 1N. Second pixels P2 and first pixels P1 may be alternately arranged in a third row 3N, and third pixels P3 may be spaced apart from each other with an interval in a fourth row 4N adjacent to the third row 3N. The pixel arrangement is repeated to an N-th row. The third pixel P3 may be greater than the first pixel P1 and the second pixel P2. For example, the third pixel P3 may have a size greater than those of the first pixel P1 and the second pixel P2.

The first pixels P1 and the second pixels P2 disposed in the first row N1 may be spaced apart from each other in a third direction ax3 and parallel to each other in a fourth direction ax4. The second pixels P2 and the first pixels P1 disposed in the third row 3N may be spaced apart from each other in the fourth direction ax4 and parallel to each other in the third direction ax3. Accordingly, a pair of first and second pixels P1 and P2 parallel to the fourth direction ax4 and a pair of first and second pixels P1 and P2 parallel to the third direction ax3 may be alternately arranged in a first column 1M. Third pixels P3 may be arranged with an interval in a second column 2M adjacent to the first column. A pair of first and second pixels P1 and P2 parallel to the fourth direction ax4 and a pair of first and second pixels P1 and P2 parallel to the third direction ax3 may be alternately arranged in a third column 3M adjacent to the second column 2M. Third pixels P3 may be spaced apart from each other with an interval in a fourth column 4M adjacent to the third column 3M. The pixel arrangement may be repeated to an M-th column.

The first structural layer 130 may be arranged between the first pixel P1 and the third pixel P3 and between the second pixel P2 and the third pixel P3. The first structural layer 130 may correspond to each side of a third emission area EA3 and surround the third emission area EA3 of one of the third pixels P3. A length $l_1$ of the first structural layer 130 in the third direction ax3 may be equal to or greater than the width $w_3$ of the third pixel P3 in the third direction ax3.

In an embodiment, in case that a driving voltage of the first pixel P1 is different from a driving voltage of the second pixel P2, a second structural layer 150 may further be arranged between the first pixel P1 and the second pixel P2. A length $l_3$ of the second structural layer 150 in the third direction ax3 may be equal to or greater than a greater width among a width $w_1$ of the first pixel P1 in the third direction ax3 and a width $w_2$ of the second pixel P2 in the third direction ax3.

In an embodiment, each of the first structural layer 130 and the second structural layer 150 may include a first sub-structural layer and a second sub-structural layer parallel to and spaced apart from each other.

In an embodiment, because the structural layers 130 and 150 are arranged in the non-emission area NEA between the pixels (e.g., the first to third pixels P1, P2, and P3), a common layer (e.g., first and second common layers 221 and 223 of FIG. 9A) provided as a body on the first to third pixels P1, P2, and P3 may be disconnected. Thus, a leakage current in a horizontal direction may be reduced. The structural layers 130 and 150 may include a lateral surface having a slope tapered in a forward direction, and some of four directions of an opposite electrode 230 (e.g., refer to FIG. 9A) formed on the structural layers 130 and 150 are not disconnected, and thus, loss in the area of the opposite electrode 230 may be reduced. Accordingly, light emission of adjacent pixels due to a leakage current (e.g., leakage current in lateral direction) may be effectively prevented, and the display quality of the display apparatus may be improved.

According to an embodiment, because light emission due to a leakage current (e.g., leakage current in lateral direction) is prevented, the display quality of the display apparatus may be improved. However, the scope of the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure.

What is claimed is:

1. A display apparatus comprising:
   a first pixel and a second pixel arranged on a substrate and adjacent to each other, and each including a pixel electrode, an opposite electrode opposing the pixel electrode, and a common layer between the pixel electrode and the opposite electrode;
   a pixel-defining layer including openings respectively corresponding to the first pixel and the second pixel and defining emission areas; and
   a structural layer arranged on the pixel-defining layer and including:
      an upper surface;
      a first lateral surface connected to the upper surface; and
      a second lateral surface connected to the upper surface, wherein
   the first lateral surface has a reverse-tapered slope,
   the second lateral surface has a forward-tapered slope,
   the common layer is integrally provided, partially discontinued by the first lateral surface, and continued by the second lateral surface, and
   the opposite electrode is integrally provided, partially discontinued by the first lateral surface, and continued by the second lateral surface.

2. The display apparatus of claim 1, wherein the first lateral surface and the second lateral surface are arranged in a first direction parallel to a side of the first pixel.

3. The display apparatus of claim 2, wherein the structural layer includes:
   a third lateral surface; and
   a fourth lateral surface,
   each of the third lateral surface and the fourth lateral surface has a forward-tapered slope, and
   the third lateral surface and the fourth lateral surface are arranged in a second direction intersecting the first direction.

4. The display apparatus of claim 2, wherein the structural layer includes:
   a third lateral surface; and
   a fourth lateral surface,
   each of the third lateral surface and the fourth lateral surface has a reverse-tapered slope, and
   the third lateral surface and the fourth lateral surface are arranged in a second direction intersecting the first direction.

5. The display apparatus of claim 2, wherein the structural layer includes:
   a third lateral surface; and
   a fourth lateral surface,
   the third lateral surface has a reverse-tapered slope,
   the fourth lateral surface has a forward-tapered slope, and
   the third lateral surface and the fourth lateral surface are arranged in a second direction intersecting the first direction.

6. The display apparatus of claim 1, wherein the structural layer includes:
   a third lateral surface; and
   a fourth lateral surface,
   the third lateral surface has a reverse-tapered slope,
   the fourth lateral surface has a forward-tapered slope,
   the first lateral surface and the third lateral surface are arranged in a first direction parallel to a side of the first pixel, and
   the second lateral surface and the fourth lateral surface are arranged in a second direction intersecting the first direction.

7. The display apparatus of claim 1, wherein the structural layer includes:
   a first sub-structural layer; and
   a second sub-structural layer,
   the first sub-structural layer and the second sub-structural layer are spaced apart from and parallel to each other between the first pixel and the second pixel, and
   the first sub-structural layer includes:
      a first upper surface;
      a (1-1)st lateral surface; and
      a (1-2)nd lateral surface, and
   each of the (1-1)st lateral surface and the (1-2)nd lateral surface is connected to the first upper surface,
   the (1-1)st lateral surface has a reverse-tapered slope,
   the (1-2)nd lateral surface has a forward-tapered slope, and
   the second sub-structural layer includes:
      a second upper surface;
      a (2-1)st lateral surface; and
      a (2-2)nd lateral surface,
   each of the (2-1)st lateral surface and the (2-2)nd lateral surface is connected to the second upper surface,
   the (2-1)st lateral surface has a reverse-tapered slope, and
   the (2-2)nd lateral surface has a forward-tapered slope.

8. The display apparatus of claim 7, wherein the (1-1)st lateral surface, the (1-2)nd lateral surface, the (2-1)st lateral surface, and the (2-2)nd lateral surface are arranged in a first direction parallel to a side of the first pixel, and
   the (1-2)nd lateral surface faces the (2-2)nd lateral surface.

9. The display apparatus of claim 7, wherein
the (1-1)st lateral surface, the (1-2)nd lateral surface, the (2-1)st lateral surface, and the (2-2)nd lateral surface are arranged in a first direction parallel to a side of the first pixel, and
the (1-2)nd lateral surface faces the (2-1)st lateral surface.

10. The display apparatus of claim 7, wherein
the (1-1)st lateral surface, the (1-2)nd lateral surface, the (2-1)st lateral surface, and the (2-2)nd lateral surface are arranged in a first direction parallel to a side of the first pixel, and
the (1-1)st lateral surface faces the (2-1)st lateral surface.

11. The display apparatus of claim 7, wherein
the first sub-structural layer includes a (1-3)rd lateral surface connected to the first upper surface and has a reverse-tapered slope,
the second sub-structural layer includes a (2-3)rd lateral surface connected to the second upper surface and has a reverse-tapered slope,
the (1-1)st lateral surface, the (1-3)rd lateral surface, the (2-1)st lateral surface, and the (2-3)rd lateral surface are arranged in a first direction parallel to a side of the first pixel, and
the (1-2)nd lateral surface and the (2-2)nd lateral surface are arranged in a second direction intersecting the first direction.

12. The display apparatus of claim 1, wherein
the first pixel and the second pixel each include an organic light-emitting diode,
the organic light-emitting diode includes:
the pixel electrode;
a lower emission layer arranged on the pixel electrode;
an upper emission layer arranged on the lower emission layer;
a charge-generating layer arranged between the lower emission layer and the upper emission layer; and
the opposite electrode arranged on the upper emission layer, and
each of the charge-generating layer and the opposite electrode is arranged as a body on the first pixel and the second pixel.

13. The display apparatus of claim 1, further comprising:
a third pixel adjacent to the first pixel and the second pixel, wherein
the first pixel, the second pixel, and the third pixel emit light in different wavelengths, respectively, and
the structural layer includes a first structural layer arranged in a first direction between the first pixel and the third pixel.

14. The display apparatus of claim 13, wherein a length of the first structural layer is equal to or greater than a width of a third emission area of the third pixel in the first direction.

15. The display apparatus of claim 13, wherein the structural layer further includes a second structural layer arranged in a second direction intersecting the first direction between the first pixel and the second pixel.

16. The display apparatus of claim 1, further comprising a third pixel adjacent to the first pixel and the second pixel, wherein
the first pixel, the second pixel, and the third pixel emit light in different wavelengths, respectively, and
the structural layer includes a first structural layer arranged in parallel to four sides of a third emission area of the third pixel.

17. The display apparatus of claim 16, wherein a length of the first structural layer in a first direction is equal to or greater than a width of the third emission area.

18. The display apparatus of claim 16, wherein the structural layer further includes a second structural layer arranged between the first pixel and the second pixel.

19. A display apparatus comprising:
a first pixel and a second pixel adjacent to each other and disposed on a substrate, and each including a pixel electrode, an opposite electrode opposing the pixel electrode, and a common layer between the pixel electrode and the opposite electrode;
a pixel-defining layer including openings respectively corresponding to the first pixel and the second pixel and defining an emission area; and
a structural layer arranged on the pixel-defining layer and including:
a first lateral surface; and
a second lateral surface, wherein
the first lateral surface has a tip structure protruding to the emission area,
the second lateral surface has a forward-tapered slope,
the common layer is integrally provided, partially discontinued by the first lateral surface, and continued by the second lateral surface, and
the opposite electrode is integrally provided, partially discontinued by the first lateral surface, and continued by the second lateral surface.

20. The display apparatus of claim 19, wherein the structural layer includes an inorganic material or an organic material.

* * * * *